United States Patent
Nishikawa et al.

[19]

[11] Patent Number: 5,878,943
[45] Date of Patent: Mar. 9, 1999

[54] METHOD OF FABRICATING AN ELECTRONIC CIRCUIT DEVICE AND APPARATUS FOR PERFORMING THE METHOD

[75] Inventors: Toru Nishikawa; Ryohei Satoh; Masahide Harada, all of Yokohama; Tetsuya Hayashida, Tokyo; Mitugu Shirai, Hatano, all of Japan

[73] Assignee: Hitachi, Ltd., Tokyo, Japan

[21] Appl. No.: 753,018

[22] Filed: Nov. 19, 1996

Related U.S. Application Data

[63] Continuation-in-part of Ser. No. 578,054, Dec. 22, 1995, Pat. No. 5,816,473, which is a continuation of Ser. No. 240,320, May 10, 1994, abandoned, which is a continuation-in-part of Ser. No. 890,255, May 29, 1992, Pat. No. 5,341,980, which is a continuation-in-part of Ser. No. 656,465, Feb. 19, 1991, abandoned.

[30] Foreign Application Priority Data

Feb. 19, 1990  [JP]  Japan  .................................... 2-036033

[51] Int. Cl.⁶ ............................ H01L 21/60; B23K 1/00
[52] U.S. Cl. ...................... 228/205; 228/207; 228/180.22
[58] Field of Search .................................. 228/219–221, 228/180.21, 180.22, 205, 207, 223; 134/40, 42

[56] References Cited

U.S. PATENT DOCUMENTS

| | | | |
|---|---|---|---|
| 4,334,646 | 6/1982 | Campbell | 228/180.22 |
| 5,526,978 | 6/1996 | Nagatsuka et al. | 228/219 |

FOREIGN PATENT DOCUMENTS

| | | |
|---|---|---|
| 58-3238 | 1/1983 | Japan . |
| 3-171643 | 7/1991 | Japan . |

*Primary Examiner*—Samuel M. Heinrich
*Attorney, Agent, or Firm*—Fay, Sharpe, Beall, Fagan, Minnich & McKee

[57] ABSTRACT

In soldering together two members such as electronic circuit devices, after an oxide or contaminated layer has been removed from the surface of a solder material or bonding pad, for example, the members are aligned in an oxidizing atmosphere. Then the solder material is heated in a nonoxidizing atmosphere to melt the solder and bond the members. Cleaning of the solder material or bonding pad is performed by sputter-cleaning, laser cleaning, mechanical polishing, or cutting.

27 Claims, 20 Drawing Sheets

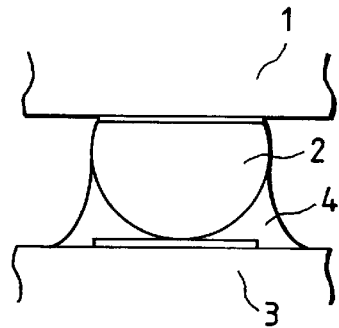
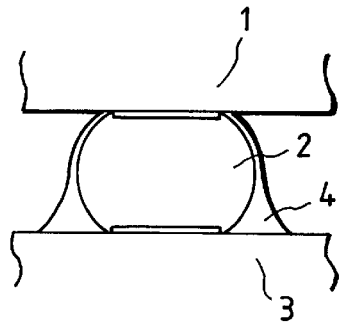
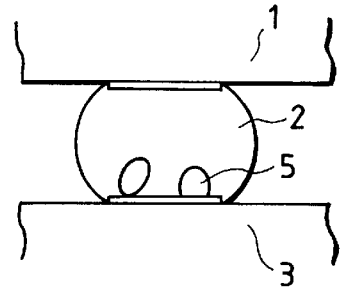
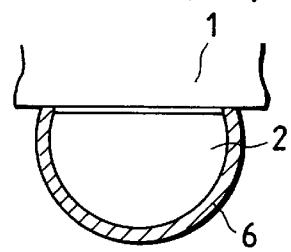
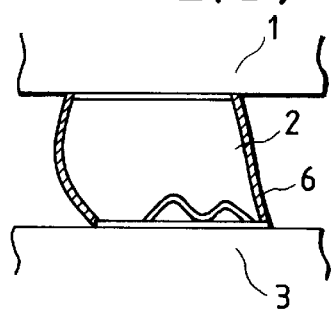
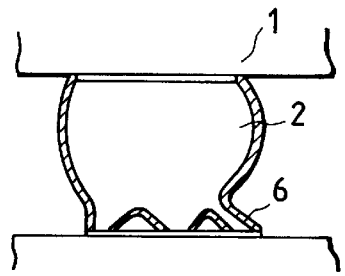

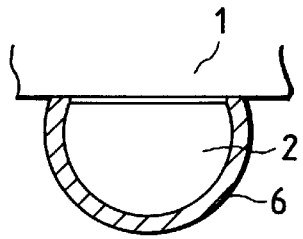 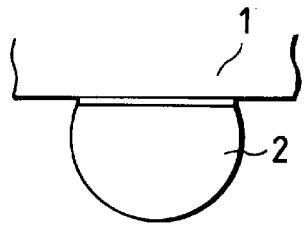
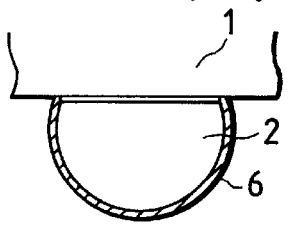 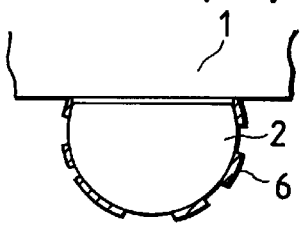
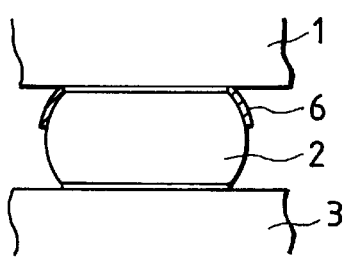
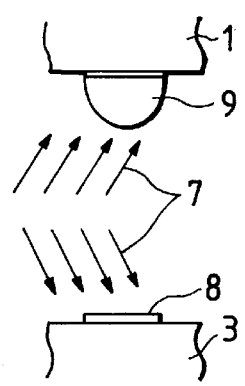 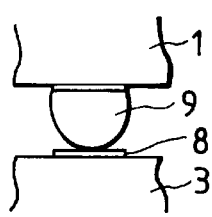 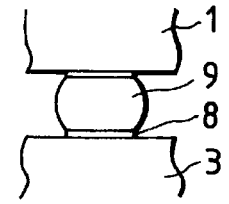
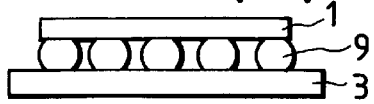

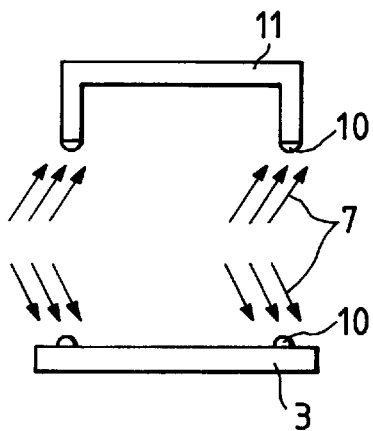
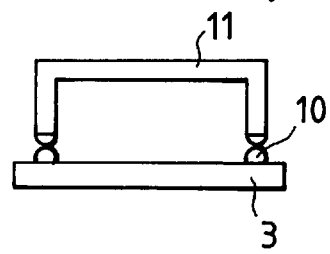
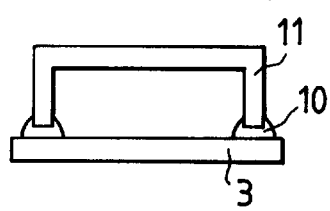
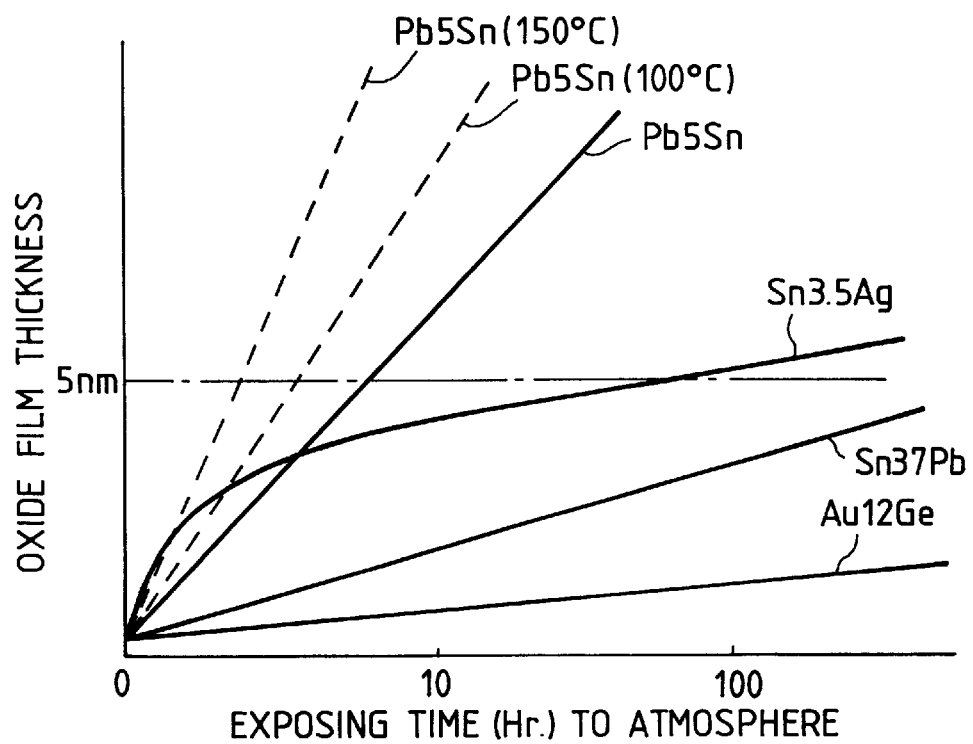

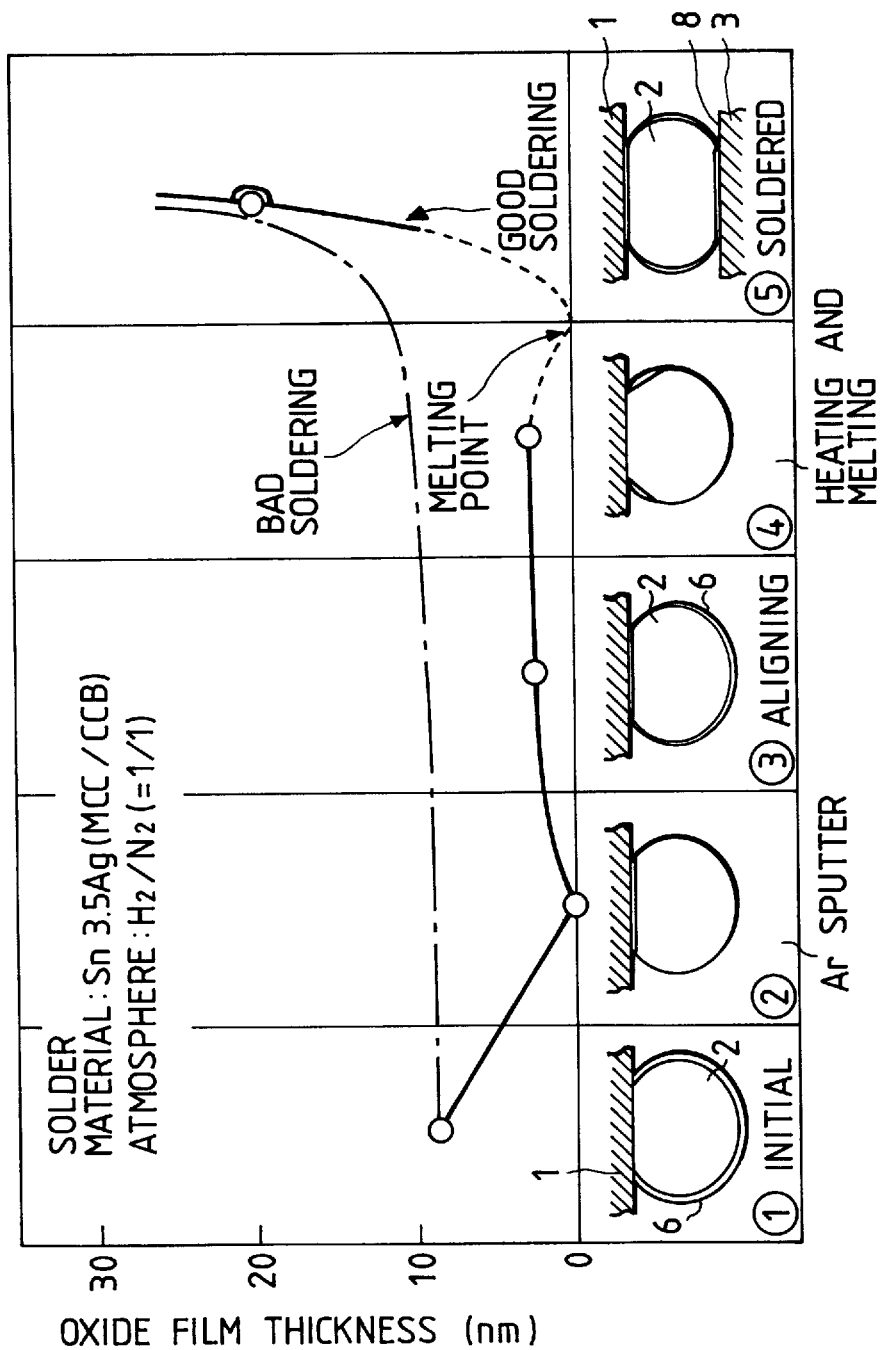

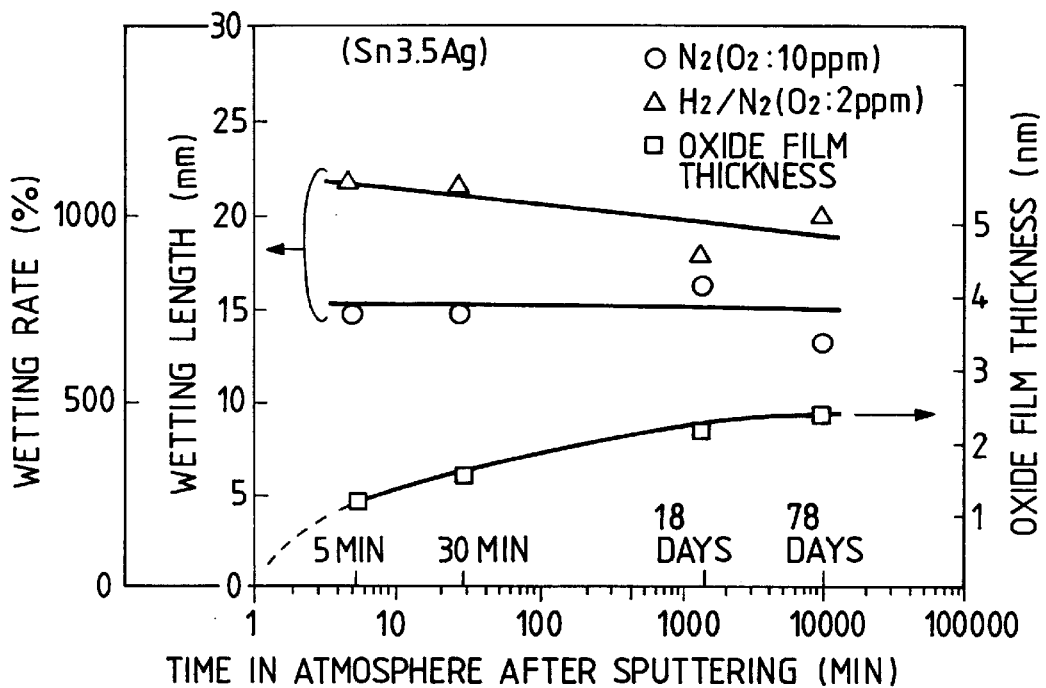
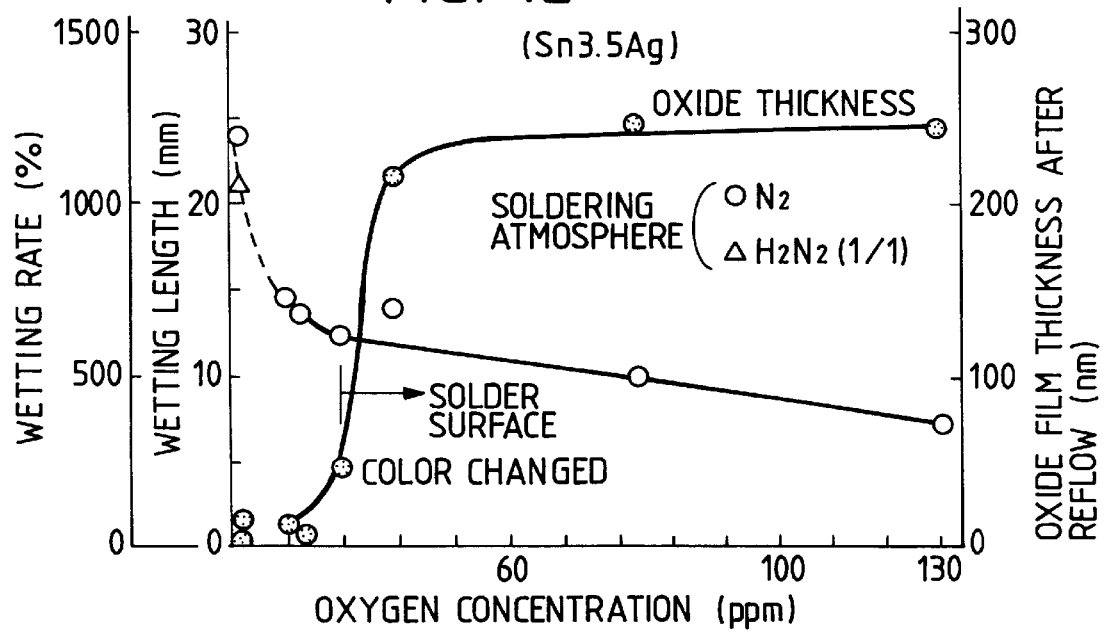

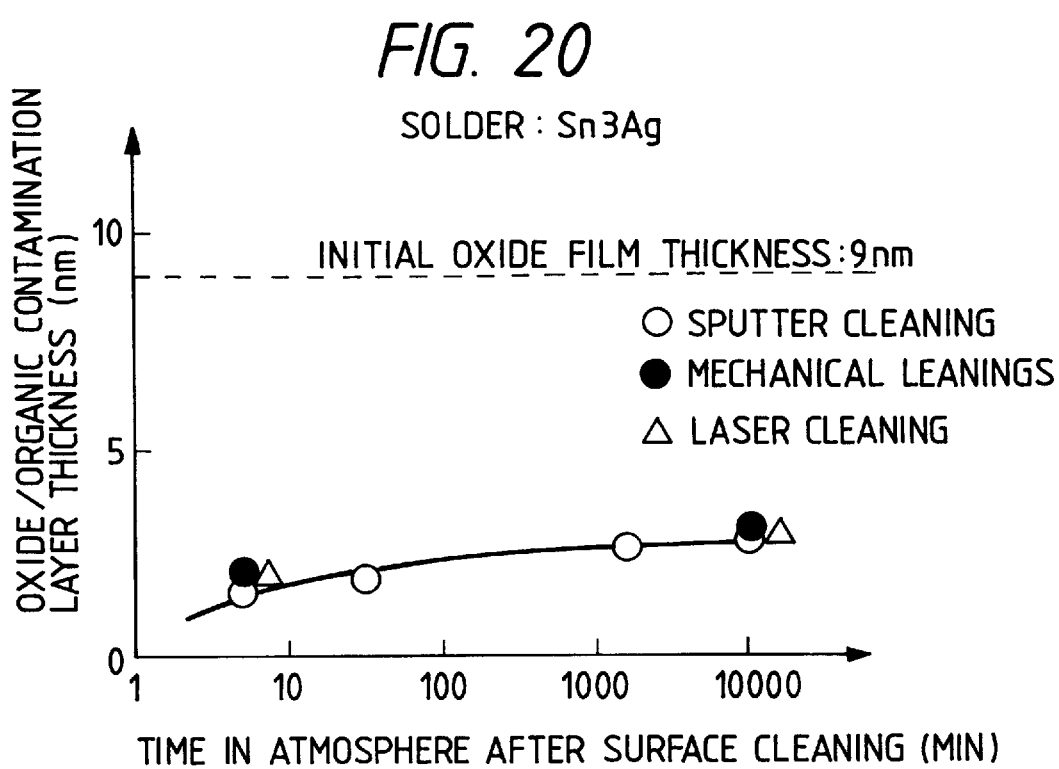

METHOD OF FABRICATING AN ELECTRONIC CIRCUIT DEVICE AND APPARATUS FOR PERFORMING THE METHOD

CROSS REFERENCE TO RELATED APPLICATION

This application is a continuation-in-part of U.S. patent application Ser. No. 08/578,054, filed on Dec. 22, 1995, now U.S. Pat. No. 5,816,473 which is a continuation application of U.S. patent application Ser. No. 08/240,320, filed on May 10, 1994, now abandoned, the entire disclosure of which is hereby incorporated by reference; which is a continuation-in-part of U.S. patent application Ser. No. 07/890,255, filed on May 29, 1992, now U.S. Pat. No. 5,341,980, which is a continuation-in-part of U.S. patent application Ser. No. 07/656,465, filed on Feb. 19, 1991, now abandoned.

BACKGROUND OF THE INVENTION

1. Field of the Invention

The present invention relates generally to electronic circuit device fabrication, and, more particularly, to the soldering of at least two different materials or members of such an electronic circuit device using a solder ball and alignment marks for aligning the elements to be connected, without using flux.

2. Description of the Related Art

When two different materials or members are to be soldered together, a flux or a cream containing flux has been used to remove oxide films formed on the soldered surfaces, to maintain these surfaces clean by preventing oxidization thereof and to promote the wettability of solder on these surfaces. However, when such a flux or flux-containing cream has been used, there has been a tendency for voids to be generated due to the evaporation of the flux during a soldering operation, as illustrated in FIG. 1(c), which results in a lowering of strength and hence reliability of the soldered junction.

Further, according to this conventional technique, environmental issues must be considered. More particularly, because the flux is typically washed by using an organic solvent such as a chloric solvent of Freon after the completion of the soldering operation, release of chlorofluorocarbons into the atmosphere results in the degradation of the atmospheric ozone layer. Restrictions on the use of such solvents further make the conventional technique unfeasible, even as it is very difficult to completely remove the flux by washing.

In an effort to solve this problem, a low-residual, low-activity flux requiring no post-soldering washing operation has been proposed. However, since such a low-activity flux is easily oxidized when heated in the atmosphere, the soldering operation must be performed in a belt furnace filled with $N_2$. Such a furnace is partitioned by shutters into an inlet gas purge chamber, a heating, melting, and bonding chamber in which air is replaced by $N_2$ sufficiently to maintain the oxygen concentration in this second chamber as low as about 70 ppm, and an outlet gas purge chamber.

Although this bonding method is easy to use, it requires the $N_2$-filled belt furnace. Therefore, fluxless soldering using an ion beam has been proposed in *J. Vacuum Science Technology*, 20(3), March 1982, pages 359–363. In soldering without flux, the oxide film must be prevented from growing on a solder surface after the surface has been cleaned by sputtering. To this end, the members to be soldered and the soldering material are aligned, and the soldering material is heated in a nonoxidizing atmosphere, which is, unfortunately, impractical in view of the facility needed to perform the operation. More particularly, a large, complicated facility is required, which inevitably results in technical difficulties in the alignment of the members.

Another fluxless soldering method has been proposed in Japanese Kokai (P) 58-3238, which describes the juxtaposition of two members to be bonded in a vacuum chamber, wherein the solder surfaces are cleaned by ion irradiation, aligned by overlapping, and then irradiated again with an ion beam to melt the solder. Since the cleaning, aligning, and heating operations are all performed within the vacuum chamber, workability and productivity are very low. More particularly, the method requires an alignment device that picks up at least one of the two members to be bonded, turns it over, carries it to the other member, and aligns a number of bonding portions on the two members. This operation requires a large-sized vacuum chamber, which increases the cost of the entire apparatus while decreasing its efficiency. Moreover, the possibility of contamination of the vacuum chamber is very high, and there is a limit to the thermal capacity of the apparatus due to the use of an ion beam, causing the simultaneous heating of large substrates to be difficult.

Another example is disclosed in Japanese Kokai (P) 3-171643. In this method, an atom or ion beam irradiation device and a post-processing device for aligning bonding portions and heating solder are separately provided. The interior of the post-processing device is filled with an inert gas. Members to be bonded together are aligned in a plenum chamber of the post-processing device and heated to a temperature below the melting point of the solder, under pressure, to temporarily fix the members, which are then transported to a heating/melting chamber of the post-processing device for the soldering to be performed.

Although no aligning device is required according to this method, the post-processing device must be kept at vacuum pressure, and the alignment and soldering performed in the post-processing device.

In spite of the problems of the prior art, the proliferation and advancement of computers and other apparatus that require electronic circuit devices employing flip-chip connections (wherein a number of fine connections are made using fine solder balls) requires a similar advancement in the precision of such connections. However, it has been very difficult to bond a number of parts using flip-chip connections within an inert atmosphere in a vacuum chamber with high precision. Furthermore, the transportation of such parts into, out of, and within the vacuum chamber, together with the evacuation of the vacuum chamber, etc., have proven troublesome, causing the workability of the prior art systems to be low.

SUMMARY OF THE INVENTION

On each solder ball 2 formed on an integrated circuit 1 to be soldered using a flip-chip connection according to the prior art, a thick oxide film or organic/contamination layer 6 forms on the surface of the soldering material as shown in FIG. 2(a). If the soldering material is heated in a nonoxidizing atmosphere such as $H_2/N_2$ or $N_2$ to form the solder connection without sputter cleaning of the oxide film, the wettability of the soldering material, formation of a spherical configuration of the soldering material, and self-alignment of the soldering material due to surface tension are insufficient, as shown in FIG. 2(b) (where reference numeral 3 indicates a second device to be soldered to the integrated circuit 1) and FIG. 2(*c*).

Therefore, an object of the present invention is to join two such members by soldering without using flux, and while avoiding the problems of the prior art discussed above.

Another object of the present invention is to perform fluxless soldering in which the alignment of the members can be performed in an atmospheric, oxidizing environment.

Another object of the present invention is to produce a solder ball that is suitable for fluxless soldering.

A further object of the present invention is to provide an alignment mark for facilitating alignment of bonding portions of two members, which is effective in fluxless soldering.

In order to achieve these objects, according to the present invention, contaminated and/or oxidized surfaces of a member or members to be soldered and of the soldering material are sputter-cleaned with atoms or ions and, after alignment of the members is performed in an oxidizing atmosphere, the soldering operation is performed in a nonoxidizing atmosphere. Alternatively, the surfaces may be cleaned mechanically, such as by polishing, cutting, laser cleaning, heat cleaning, etc.

Further-more, contaminated and/or oxidized surfaces of the member or members to be soldered are removed and, after the members have been aligned with each other in an oxidizing atmosphere, the soldering operation is performed in a nonoxidizing atmosphere.

The soldering material may be composed of any constituent elements, provided that the soldering material is capable of joining metals together. For example, any one of an Sn—Pb alloy, an Sn—Ag alloy, an Sn—In alloy, an Sn—Bi alloy, an Au—Sn alloy, an Au—Ge alloy, or a mixture of these alloys, is considered suitable.

The contaminated and/or oxidized surfaces may be removed by any suitable method. For example, a sputter-cleaning method using atoms or ions, a mechanical cleaning method, such as polishing or cutting, a laser cleaning method, or an organic material heat-cleaning method may be employed. It is not suggested that these methods are all equivalent to one another.

A fluxless soldering apparatus constructed according to the teachings of the present invention includes means for removing an oxidized solder film, means for aligning bonding portions of connecting members in an oxidizing atmosphere, and heating means for heating the bonding portions to be soldered in a nonoxidizing atmosphere or a reducing atmosphere. Further, the apparatus comprises evacuation means for evacuating the interior of the heating means, means provided in the heating means for supplying a nonoxidizing gas such as $N_2$, Ar, or Ag, or any mixture thereof, or a reducing gas such as a mixture of $H_2$ and $N_2$, into the interior of the heating means, and control means for controlling the concentration of the gas.

The heating means is partitioned into a plenum chamber, a heating and soldering chamber having a belt furnace for heating solder of the connecting members, and a cooling chamber for cooling the soldered members, each chamber including a vacuum system and a gas supply system, through which a belt conveyor passes. The apparatus has gate valves between atmosphere and the plenum chamber, between adjacent chambers, and between the cooling chamber and atmosphere, to permit communication therebetween.

The plenum chamber is evacuated with or without heating to remove water or gas components adsorbed in the members to be connected, to prevent the concentration of required gas in the heating and soldering chamber from being lowered.

Further, a sputter-cleaning device is provided for removing oxide films and/or contaminated surfaces of the bonding portions of the electronic circuit and/or solder by means of an atom or ion beam. Alternatively, a mechanical device may be used for removal of the oxide films or contaminated surfaces of the solder and/or the connecting members.

In another embodiment, a laser beam projecting device may be used for removing the oxide films or contaminated surfaces. In fact, a device of any type may be used for removing the oxide films or contaminated surfaces, provided that the device is capable of removing the oxide films or contaminated surfaces suitably, in keeping with the environmental and other objectives of the present invention.

As mentioned above, the apparatus may also be provided with a means for supplying an organic material of the type and effect described above.

Although unnecessary to the practice of the basic invention, the solder balls may be gold-plated. The gold-plating may be performed after reducing the surfaces thereof with a diluted acid solution. In this case, the oxide film-removing step may be omitted.

The alignment of the members is performed in an atmospheric environment by using alignment mark means which comprises a protrusion formed on each bonding portion of one of the two members, and a recess formed in a protrusion formed on a corresponding bonding portion of the other member, to receive the protrusion of the first member. At least a portion of each protrusion is formed of a solder ball melt-bonded thereto, or of a refractive resin material.

BRIEF DESCRIPTION OF THE DRAWINGS

FIGS. 1(*a*)–1(*c*) are cross-sections showing a conventional soldering procedure;

FIGS. 2(*a*)–2(*c*) are cross-sections showing a procedure for soldering without flux, wherein the surface of the soldering material is not sputter-cleaned;

FIGS. 3(*a*)–3(*e*) are cross-sections showing a fluxless soldering procedure performed after the solder surface is sputter-cleaned, according to a principle of the present invention;

FIGS. 4(*a*)–4(*d*) are cross-sections illustrating the soldering of a semiconductor integrated circuit onto a ceramic substrate, according to an embodiment of the present invention;

FIGS. 5(*a*)–5(*c*) are cross-sections showing the soldering of a sealing cap onto a ceramic substrate, according to an embodiment of the present invention;

FIG. 6 is a graph showing a relationship between time of exposure to an oxidizing atmosphere and oxide film thickness for various soldering materials, after sputter-cleaning;

FIG. 9 is a graph showing an example of soldering according to the steps of FIGS. 3(*a*)–3(*e*);

FIG. 11 is a graph showing details of oxide film thickness and soldering characteristics of a solder ball, during which the solder ball is in an atmospheric environment;

FIG. 12 is a graph showing the relationship between atmospheric oxygen concentration during soldering and oxide film thickness and soldering characteristics of the solder ball;

FIG. 20 illustrates the relationship between the thickness of an oxide film on a solder ball and time of formation in an atmospheric environment;

DETAILED DESCRIPTION OF THE PREFERRED EMBODIMENTS

Figure 7:
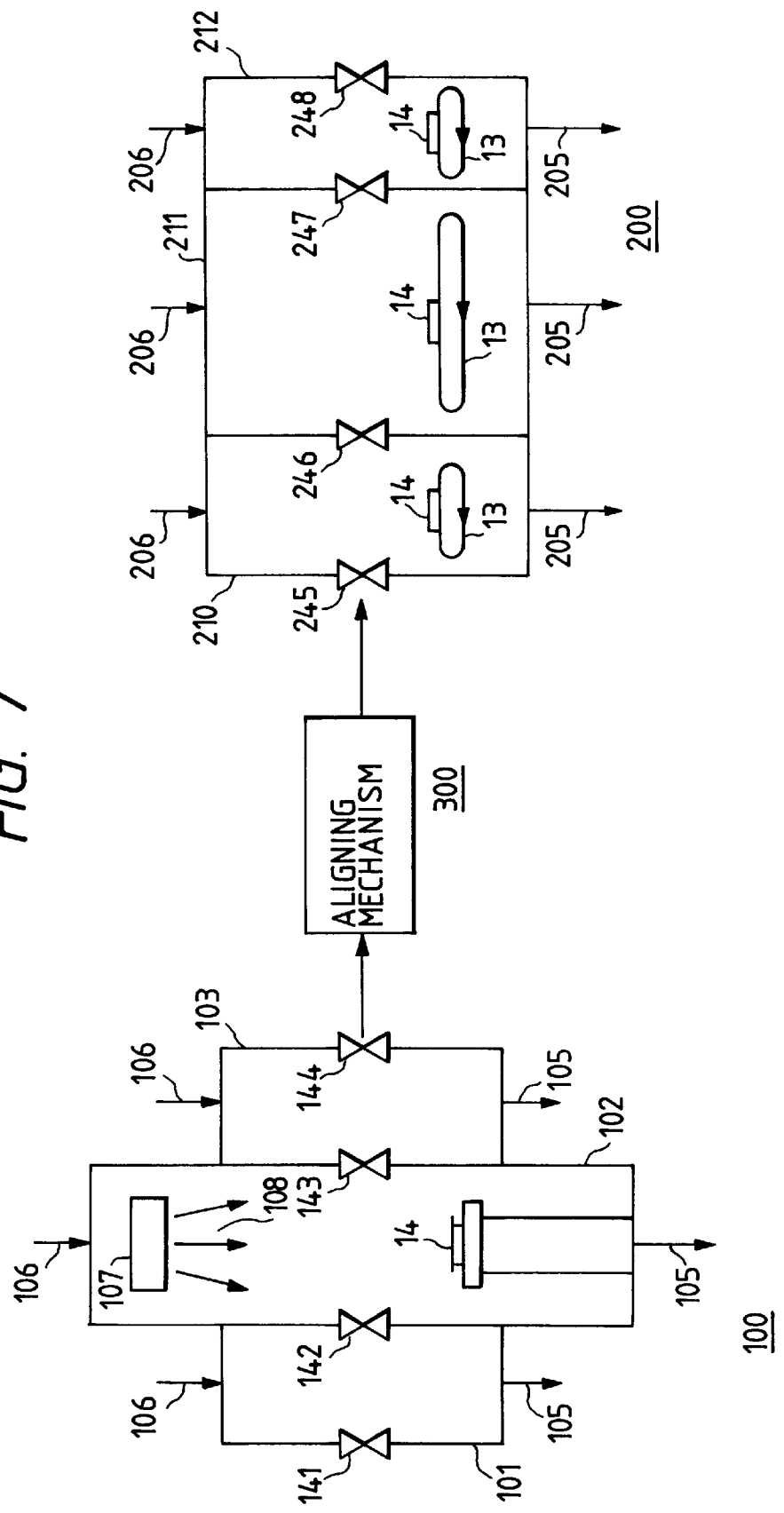
FIG. 7 is a block diagram showing a soldering apparatus constructed according to the teachings of an embodiment of the present invention.

Preferred embodiments of the present invention will now be described with reference to FIGS. 3–5.

The invention solves the problem of film formation (thick oxide, contamination, etc.) as shown in FIGS. 3(a)–3(e). As shown in FIG. 3(a), for an electronic circuit device 1 (the invention is not limited to a particular device) on which a solder bump, for example, has been provided, a surface of the soldering material 2 on which a thick oxide film 6 is formed is sputter-cleaned to remove the oxide film 6 as shown in FIG. 3(b). After the sputter-cleaning, another oxide film 6 may be formed as shown in FIG. 3(c), but which may be thin compared with the oxide film removed by the sputter-cleaning. By then heating the soldering material 2 in a nonoxidizing atmosphere, the soldering material is expanded to segment the thin film 6, thereby exposing clean surface portions as shown in FIG. 3(d). In this state, soldering is performed without flux, resulting in the state shown in FIG. 3(e) in which the soldering material wets on a surface of a member 3 (which may be metallized) to be soldered, resulting in a desirable junction.

The initial thick oxide film or contamination 6 on the surfaces of the members to be soldered and on the soldering material can be removed by sputter-cleaning with atoms or ions. Further, by thereafter heating and melting the soldering material in a nonoxidizing atmosphere, reoxidation of the solder surface can be prevented, thereby maintaining the solder surface clean for high wettability. The time during which the fluxless soldering can be performed before adverse reoxidation or recontamination of the soldering material surface is based upon the time dependency of the thickness of the reformed film.

On the other hand, alignment of the members to be joined can be performed in an oxidizing atmosphere, which simplifies the aligning operation.

FIGS. 4(a)–4(d) illustrate a first embodiment of the present invention as applied to the soldering of a ceramic substrate 3 to a semiconductor integrated circuit 1. In a particular example, a semiconductor integrated circuit 1 was soldered, using $Pb_5Sn$, for example, to a metallization pad 8, which was formed on the ceramic substrate 3 by baking molybdenum or tungsten on the ceramic substrate 3, followed by plating with nickel and gold, for example.

As shown in FIG. 4(a), the solder 9 and each metallization pad 8 were sputter-cleaned with argon atoms 7 to remove any oxide film or organic contamination layer thereon. Then, after a positional alignment was performed (FIG. 4(b)) in an oxidizing atmosphere for a time T (in this case, 30 minutes), the ceramic substrate 3 and semiconductor integrated circuit 1 were heated in a $H_2/N_2$ furnace ($H_2:N_2$=1:1 or 1:3) until the soldering material 9 was melted. FIG. 4(c) illustrates that a good solder junction was obtained without using flux. Finally, FIG. 4(d) illustrates the completed configuration.

An experiment was conducted to determine the maximum time T during which the members to be soldered and the soldering material can be handled in an oxidizing atmosphere (e.g., during alignment) without a detrimental effect on the resultant soldering, by performing the procedure described above for alignment times T between one hour and eight hours, with one-hour increments. The results of the experiment show that a good solder junction was obtained for T≦five hours, while T=eight hours resulted in a non-spherical soldering material shape (although a good solder junction was also obtained). Therefore, it is considered that T=eight hours is the working upper limit for acceptable soldering.

The process of FIGS. 4(a)–4(d) may be carried out using the apparatus shown in FIG. 7. This apparatus will be discussed in greater detail below.

FIGS. 5(a)–5(c) show another example according to the present invention, wherein a cap 11 of AlN was soldered to a ceramic substrate 3 with a Sn37Pb solder 10 to form a sealed structure. As shown in FIG. 5(a), the solder bumps 10 on both the cap 11 and the ceramic substrate 3 were sputter-cleaned with argon atoms 7 to remove oxide films or contamination layers thereon. Then, following an alignment procedure performed in 30 minutes in an oxidizing atmosphere, the cap 11 and ceramic substrate 3 were put in a $H_2/N_2$ furnace so that the solder 10 was melted and the cap and substrate joined without using flux (the soldering material was also applied to the respective members without using flux). See FIGS. 5(b) and 5(c). A favorable junction was obtained.

A similar experiment to that described above was conducted to determine the maximum time T for which the members to be soldered and the soldering material could be handled in an oxidizing atmosphere, during alignment, without a detrimental effect on the resultant soldering. The results of the experiment showed that a good solder junction was obtained for a time T≦five hours, while T=eight hours resulted in a nonspherical, though acceptable, solder junction. Therefore, it is considered that T=eight hours is a suitable upper limit for this embodiment.

Other Pb and Sn alloy solders having different constituent ratios than those mentioned above, and other solder materials belonging to the group of Sn, Ag alloys; Au, Sn alloys; Au, Ge alloys; and Au, Si alloys are also acceptable. In any case, the aligning operation is easily performed in an oxidizing atmosphere, and the soldering operation in a nonoxidizing furnace, using a simple facility.

FIG. 6 plots oxide film thickness versus exposure time at room temperature (solid-line curves), with the preferred permissible oxide film thickness of 5 nm noted on the Y axis. The upper limit of exposure time can be obtained qualitatively from the relation between exposure time and oxide thickness as graphed, namely about six hours or more depending upon the soldering material, which is substantially coincident with the results obtained and described above with respect to the embodiments of FIGS. 4(a)–4(d) and 5(a)–5(c). Further, as shown by dotted lines in FIG. 6, the speed of oxide film growth increases with temperature. Therefore, the exposure time in the oxidizing atmosphere should be made shorter with increasing temperature.

In order to solder the members with a soldering material that has a reoxidized film whose thickness is that obtained after sputter-cleaning, the soldering material should satisfy the following conditions: minimum void, good wettability for the member to be soldered, resultant soldering material shape corresponding to that defined by surface tension thereof, self-alignment to correct any deviation during soldering, and high reliability (where T~ is the high temperature strength, and ~ is the number of cycles). Soldering junctions obtained by the present invention ($H_2/N_2$ atmosphere) and by the conventional method (without sputter-cleaning, with and without flu are shown in Table 1.

TABLE 1

| Solder | Wettability (>100%) | Void | Shape | Self-align | Temp. cycle (T~test for ~55 to +150° C., after 1,000~) |
|---|---|---|---|---|---|
| INVENTION ($H_2/N_2$ FURNACE) | | | | | |
| 1. Pb2Sn | ○ | small | ○ | ○ | ○ |
| 2. Pb5Sn | ○ | small | ○ | ○ | ○ |
| 3. Pb10Sn | ○ | small | ○ | ○ | ○ |
| 4. Sn37Pb | ○ | small | ○ | ○ | ○ |
| 5. Sn3.5Ag | ○ | small | ○ | ○ | ○ |

TABLE 1-continued

| Solder | Wettability (>100%) | Void | Shape | Self-align | Temp. cycle (T~test for ~55 to +150° C., after 1,000~) |
|---|---|---|---|---|---|
| 6. Au12Ge | ○ | small | ○ | ○ | — |
| PRIOR ART ($N_2$ FURNACE) FLUX | | | | | |
| 1. Pb2Sn | ○ | large | ○ | ○ | Δ(2) |
| 2. Pb5Sn | ○ | large | ○ | ○ | Δ(3) |
| 3. Sn37Pb | ○ | large | ○ | ○ | Δ(5) |
| 4. Sn3.5Ag | ○ | large | ○ | ○ | Δ(2) |
| PRIOR ART ($N_2$ FURNACE) NON-FLUX | | | | | |
| 5. Pb5Sn | x | small | x | x | — |
| 6. Sn3.5Ag | x | small | x | x | — |
| 7. Au12Ge | x | small | A | A | — |

Note: ○ denotes a good result; Δ denotes an acceptable, but not good, result; and x denotes a bad result. The number in parentheses in the Temperature cycle column for the conventional method using flux denotes the number of damaged junctions among 20 junctions tested.

The solder junction obtained according to the present embodiment exhibits good wettability, shape, and self-alignment characteristics, similar to those obtained by the conventional method using flux. Any voids are very small, which may be due to the nonuse of flux. As to the temperature cycle duration, the present invention betters that of the conventional method using flux. Further, the conventional method using no flux exhibits worse results for each factor. The same results are obtained for other inert gas furnaces, such as an Ar furnace, a He furnace, a $N_2$ furnace, and a fluorocarbon (e.g., Freon) vapor furnace. However, in these furnaces, the oxygen concentration should be restricted to about 10 ppm or lower. Further, a reducing gas furnace of, for example, $H_2/N_2$ or $H_2$ gas, may be used. Regardless of the furnace, the fluxless soldering method economically produces a reliable electronic device that has a large thermal capacity by soldering in an oxidizing atmosphere, which improves upon the prior art method in the workability thereof, using a simple facility and generating no significant pollution by comparison.

An embodiment of a fluxless soldering apparatus according to the invention is illustrated in FIG. 7, which shows a sputter-cleaning device 100 and a belt furnace 200, between which an alignment mechanism 300 is provided. The sputter-cleaning device 100 includes a plenum chamber 101, a cleaning chamber 102, and an outlet chamber 103. A conventional gas introducing system supplies gas at 106 to the plenum chamber 101 and outlet chamber 103, which are purged by evacuation and subsequent communication to atmosphere at 105. Gate valves 141, 142, 143, and 144 provide access to the various chambers.

Gas is supplied to a gun 107 provided within the cleaning chamber 102 to emit ions and/or atoms. Solder portions (solder balls, connecting pads, etc.) of one or more members 14 in the sputter-cleaning device 100 are irradiated simultaneously with the ions and/or atoms to remove oxide films and/or organic contamination films thereon. The cleaning chamber 102 is evacuated at 105. The member 14 thus cleaned is transported to the alignment mechanism 300, and after alignment is transported to the belt furnace 200, preferably by one or more belt conveyors.

The belt furnace 200 includes a plenum chamber 210, a heating and welding chamber 211, and a cooling chamber 212, all of which can be evacuated, and which are accessible by gate valves 245, 246, 247, and 248. Each chamber of the belt furnace 200 is equipped with an evacuating system 205 and a gas introducing system 206, for purging and introduction of nonoxidizing gas, respectively. Alternatively, the evacuation system may be omitted if an inert gas such as $N_2$, Ar, or He is substituted for the nonoxidizing gas. The member 14 is transported through the belt furnace 200 via the respective chambers 210, 211, and 212 by belt conveyors 13.

Figure 8:
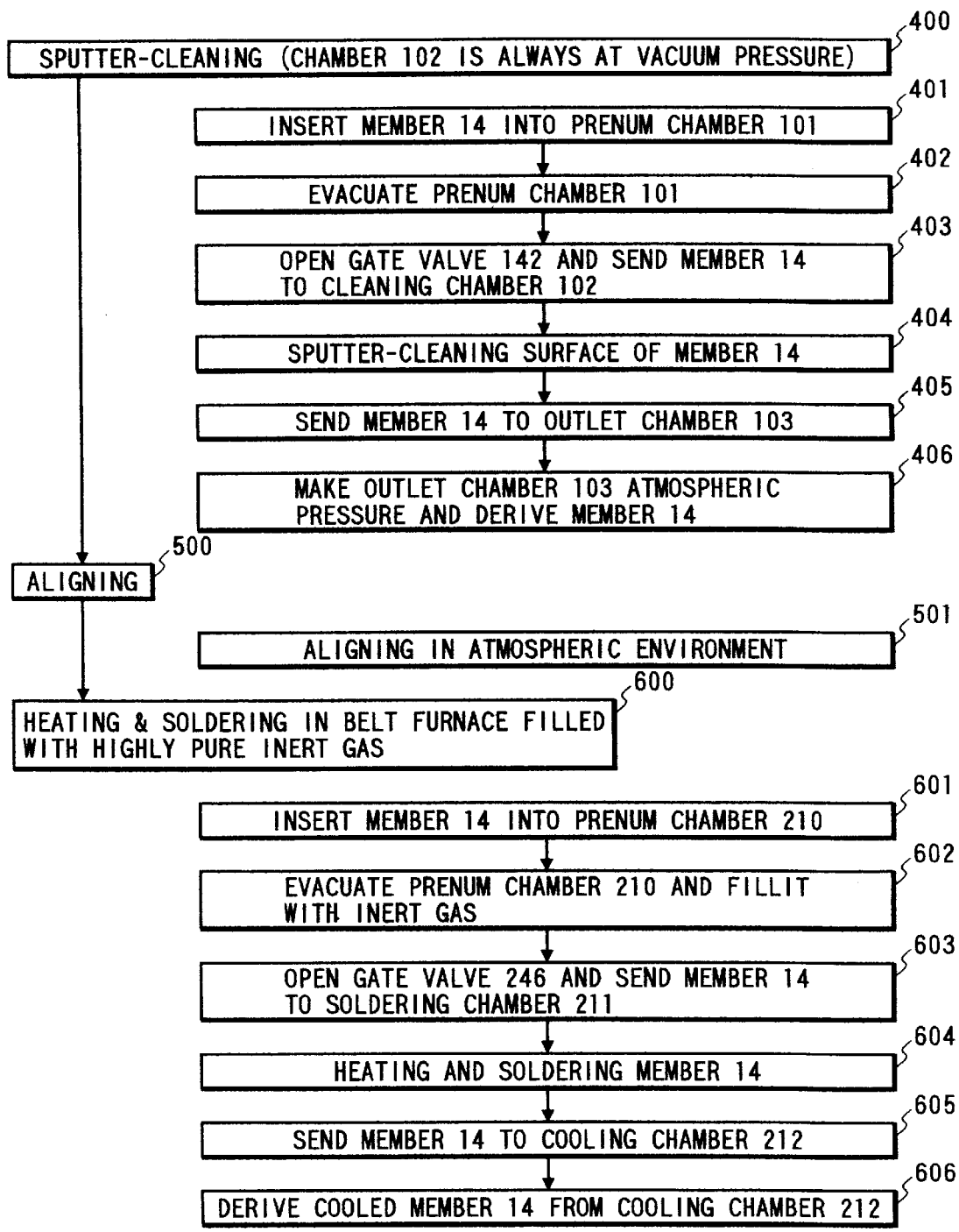
FIG. 8 is a flowchart showing an operation of the apparatus illustrated in FIG. 7.

FIG. 8 is a flowchart illustrating a fluxless soldering operation performed by the apparatus of FIG. 7. It is assumed that all of the gate valves 141 to 144 and 245 to 248 are initially closed.

At step 400, any oxide film or organic contaminating film on the bonding pads of the member 14 and on the solder portions is sputter-cleaned by the sputter-cleaning device 100. The sputter-cleaning is performed according to steps 401–406, which are considered to be included in step 400. Throughout the cleaning process, the cleaning chamber 102 is continuously evacuated so that a vacuum pressure higher than $10^{-5}$ Torr is maintained therein.

In step 401, the gate valve 141 of an inlet to the plenum chamber 101 of the sputter-cleaning device 100 is opened to admit the presoldered member 14. In step 402, the plenum chamber 101 is evacuated. When there is significant gas and/or water content adsorbed by the member 14, heating is performed simultaneously with the evacuation of the plenum chamber 101, to thereby prevent the vacuum condition in the subsequent cleaning chamber 102 from being degraded. A baking device may be provided at the front of the plenum chamber 101. The baking device may perform evacuation and heating.

In step 403, the gate valve 141 between the plenum chamber 101 and the cleaning chamber 102 is opened so that the member 14 is transported into the cleaning chamber 102. Thereafter, the gate valve 145 is closed and, in step 404, the member 14 in the cleaning chamber 102 is irradiated with ions and/or atoms 108 from the gun 107 while being rotated, to remove undesired films on the solder and the connecting pads.

In step 405, the outlet side gate valve 143 of the cleaning chamber 102 is opened, the cleaned member 14 is transported into the outlet chamber 103 at vacuum pressure, and the gate valve 143 is closed. Then, in step 406, the outlet chamber 103 is adjusted to atmospheric pressure and its outlet side gate valve 144 is opened so that the member 14 can be removed.

In step 500, two cleaned members 14 are aligned by an alignment mechanism 300 in an atmospheric environment.

In step 600, fluxless soldering is performed in the belt furnace 200. A nonoxidizing atmosphere is continuously maintained in the heating and welding chamber 211 of belt furnace 200 (FIG. 7) by evacuation and subsequent introduction of a nonoxidizing gas.

Step 600 includes steps 601 to 606. In step 601, the inlet side gate valve 245 of the plenum chamber 210 is opened to admit the aligned embers 14 into the plenum chamber. In step 602, the plenum chamber is evacuated and then filled with the nonoxidizing gas.

In step 603, the gate valve 246 between the plenum chamber 210 and the heating and soldering chamber 211 is opened to permit the members 14 to enter the heating and soldering chamber, and, in step 604, the gate valve 246 is closed. The members 14 are then heated to melt the solder.

In step 605, the gate valve 247 between the heating and soldering chamber 211 and the cooling chamber 212 is opened to permit the soldered members 14 to be transported into the cooling chamber. After the cooling, the cooling chamber 212 is adjusted to atmospheric pressure and the members 14 are removed through the gate valve 248.

The concentration of the nonoxidizing gas in the heating and soldering chamber 211 can be selected arbitrarily on the basis of the vacuum pressure to be established therein and on the concentration of the inert gas to be introduced. Therefore, the apparatus according to this embodiment can be used suitably for the fluxless soldering of any combination of solder material and members 14 to be bonded thereby.

When a solder material is employed that exhibits superior wettability, such as a Sn-containing solder material, the plenum chamber 210 and the cooling chamber 213 may be omitted, and the cooling chamber 212 may be filled with an inert gas such as $N_2$, Ar, or He. Moreover, it is possible to restrict the oxygen concentration further by introducing $H_2$ into the inert gas and allowing a reaction between the $H_2$ and residual. Alternatively, the evacuation systems of the belt furnace may be omitted in favor of a belt furnace in which the atmospheric gas is replaced by the inert gas.

FIG. 9 illustrates, using a solid line, a variation of thickness of an oxide film on the solder ball 2 for the states shown in FIGS. 3(a)–3(e) when the solder ball is of Sn3.5Ag (MCC/CCB) in an $H_2/N_2$ (1:1) atmosphere, and the solder bonds a ceramic chip 1 to a substrate 3. As shown, the initial oxide film thickness of about 10 nm in the initial state shown in FIG. 3(a) is reduced to almost zero in the sputtering state shown in FIG. 3(b), and then gradually increases to about 2 to 3 nm until heating in FIG. 3(d). Heating fractures the oxide film 6 to expose a clean surface at which the bonding takes place in FIG. 3(e). Thereafter, the thickness of the oxide film continues to increase. A chain line in FIG. 9 shows the thickness of the oxide film in the absence of the invention.

FIGS. 10(a) through 10(d) show an example of a method for welding solder balls 2 to bonding pads 8 of, for example, a substrate of a large-scale integrated circuit (LSI).

Figure 10A:
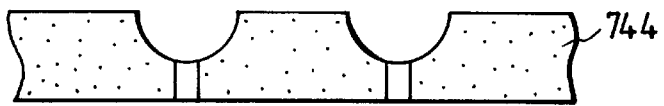
FIGS. 10(*a*)–10(*d*) illustrate steps of welding solder balls to a printed circuit board.
Figure 10B:
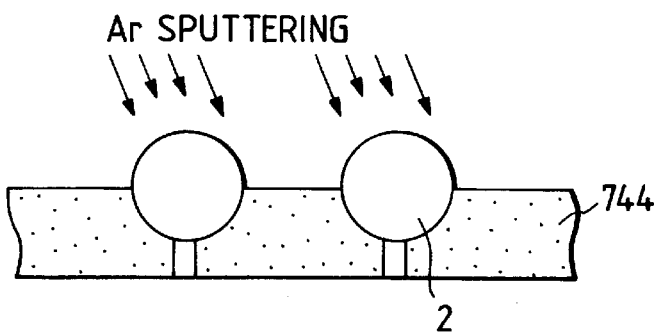

First, as shown in FIG. 10(a), a positioning plate 744 is prepared. The positioning plate may be fiberglass, and has recesses for receiving the solder balls 2. The solder balls are supplied onto the positioning plate 744 and deposited into the recesses by vibrating the positioning plate. The solder balls are held in the recesses by applying negative pressure via respective ducts in the recesses. Then, as shown in FIG. 10(b), the solder balls 2 are sputtered by irradiation with, for example, a beam of Ar atoms to remove any oxide film thereon.

Figure 10C:
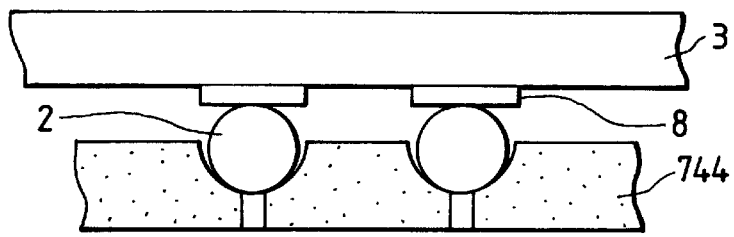
Figure 10D:
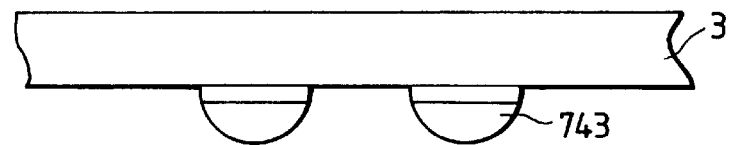
Figure 13:
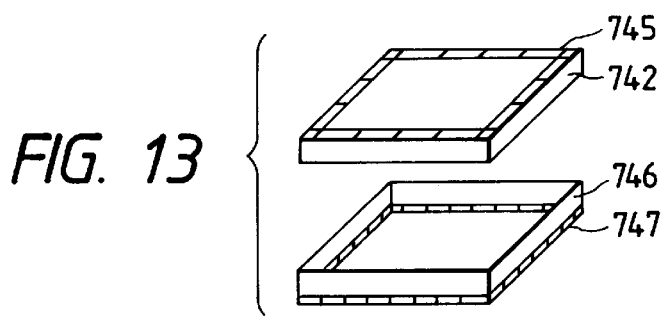
FIG. 13 is a perspective view of a substrate and a roof plate.

Next, as shown in FIG. 10(c), a printed circuit board 3 is oriented over the solder balls 2 so that the solder balls align with bonding pads 8 of the circuit board. Then, the solder balls are heated to melt the solder and bond the solder balls to the respective bonding pads, as shown at 743 in FIG. 10(d).

FIG. 11 plots the oxide film thickness, wetting rate, and wetting length of the solder against time in the atmosphere after sputter-cleaning. The curve tracing a succession of points marked by squares shows the variation of oxide thickness over time on a solder ball of Sn3.5Ag; the curve tracing a succession of points marked by circles shows the wetting rate over time when identical solder balls are welded to bonding pad surfaces similarly sputter-cleaned in the belt furnace 200 shown in FIG. 7 using $N_2$ gas; and the curve tracing a succession of points marked by triangles shows the wetting length over time when identical solder balls are welded to bonding pad surfaces similarly sputter-cleaned in the belt furnace 200 shown in FIG. 7 using $H_2/N_2$ gas.

As is clear from FIG. 11, the thickness of the oxide film on the solder reaches 1 nm within several minutes after being put in an atmospheric environment, and never increases beyond 2 to 3 nm even after several days. As mentioned previously with respect to FIGS. 3(a)–3(e), the heating and soldering process may be performed in the belt furnace 200 so long as the oxide film thickness is not more than 2 to 3 nm. Further, FIG. 11 shows that, although the wetting length and wetting rate characteristics are reduced slightly with time in the atmospheric environment, the wettability is still acceptable even after seven days.

Since FIG. 11 shows that it takes a very long time for the thickness to reach 5 nm, which may be considered the practical upper limit, there is no need to limit the time for which the solder material can by put in the atmospheric condition after being sputter-cleaned.

FIG. 12 shows plots of the thickness of the oxide film on a solder ball of Sn3.5Ag and the wetting rate and wetting length thereof when soldered in the belt furnace 200 with respect to the oxygen concentration in the belt furnace.

When the oxygen concentration exceeds 20 ppm, the oxide film thickness increases abruptly, to beyond 20 nm. Further, the wetting rate and wetting length are reduced remarkably until the oxygen concentration reaches 20 ppm. Beyond 20 ppm, the color of the solder surface changes to light violet, and the solder becomes, practically, useless.

Next, an embodiment will be described with reference to FIGS. 13 and 14(a) through 14(f), in which a roof plate 747 having a frame 746 is bonded to a substrate 742 having a metallized portion 745.

Figure 14A:
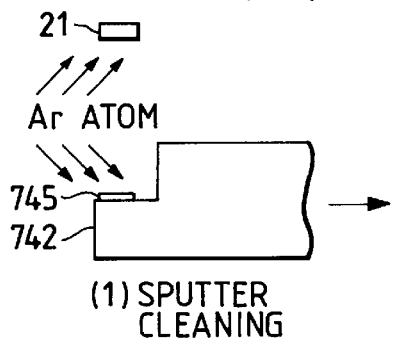
FIGS. 14(a)–14(f) show steps for soldering the frame of a roof plate to a substrate, according to the present invention.
Figure 14B:
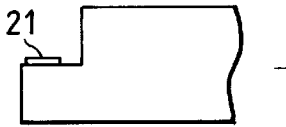
Figure 14C:
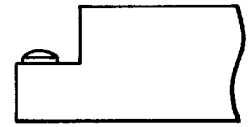

As shown in FIG. 14(a), the metallized portion 745 and solder 21 are sputtered with Ar ions to remove an oxide film from the solder 21. The solder 21 is then put on the metallized portion 745 as shown in FIG. 14(b). Then, as shown in FIG. 14(c), the solder 21 is melted in a nonoxidizing atmosphere.

Figure 14D:
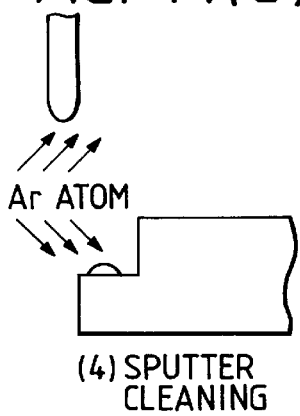
Figure 14E:
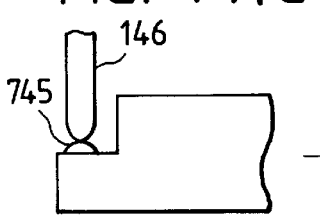
Figure 14F:
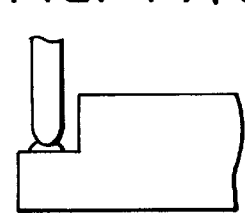

Thereafter, the frame 746 and the solder 21 on the metallized portion 745 are again ion-sputtered as shown in FIG. 14(d), the frame 746 is aligned with the metallized a portion 745 as shown in FIG. 14(e), and the frame and metallized portion are reflow soldered in a nonoxidizing atmosphere as shown in FIG. 14(f).

Figure 15:
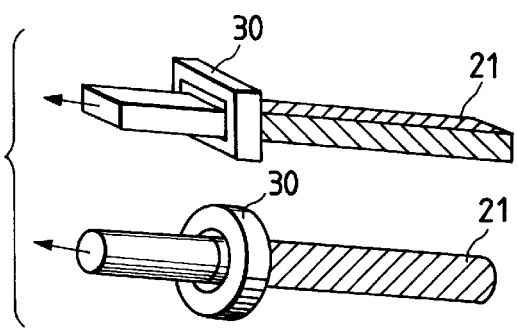
FIG. 15 illustrates a method of mechanically removing an oxide film from a solder surface, according to the present invention.

FIG. 15 illustrates another embodiment of oxide film removal according to the present invention. In this embodiment, mechanical removal of the oxide film is employed instead of sputter cleaning. FIG. 15 illustrates solder material 21 that is formed as a rod having a rectangular cross-section or a circular cross-section. The solder rod can be passed through a corresponding die 30 having a cross-section smaller than that of the solder rod 21. Similarly, the oxide film removal shown in FIGS. 3(a)–3(e) may be performed by polishing or cutting a top portion of the solder ball 2. The mechanical oxide film removal can be used in combination with the sputter cleaning.

Figure 16A:
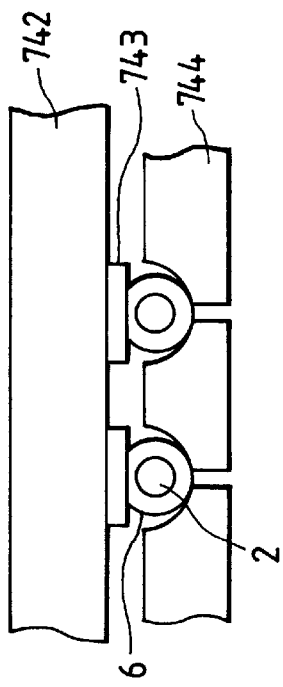
FIGS. 16(a) and 16(b) illustrate steps for removing an oxide film from a solder ball mechanically, and for soldering the solder ball onto a substrate, according to the present invention.
Figure 16B:
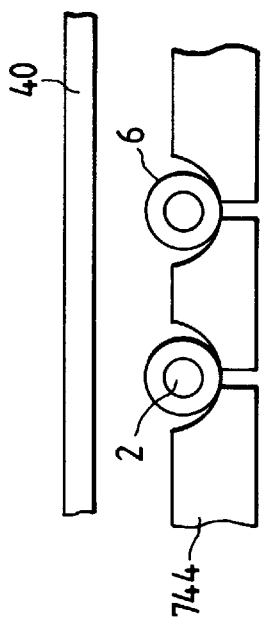

FIGS. 16(a) and 16(b) illustrate a method of welding solder balls 2 to pads 743 on a mechanically-polished substrate 742.

As shown in FIG. 16(a), the solder balls 2 are located in recesses of a positioning plate 744 of, for example, glass fiber, and held stably therein as in the case shown in FIG. 10(b). Top portions of the positioning plate 744 are polished by laterally moving or vibrating a polishing cloth 40. Then, as shown in FIG. 16(b), the pads 743 on the substrate 742 are brought into contact with the solder balls 2 whose top portions are polished and heated in a nonoxidizing atmosphere.

Figure 17A:
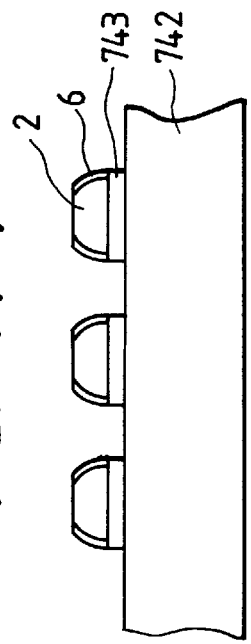
FIGS. 17(a) and 17(b) illustrate a mechanical removal of an oxide film from a solder ball on a substrate, according to f the present invention.
Figure 17B:
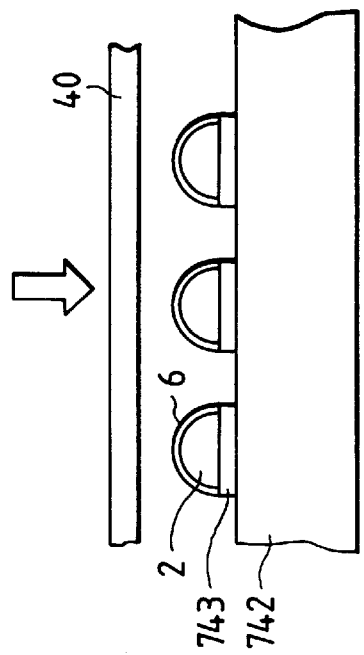

FIGS. 17(a) and 17(b) illustrate a mechanical polishing method for polishing top portions of solder balls 2, which are welded to pads 743 on a substrate 742. As shown in FIG. 17(a), the top portions of the solder balls 2 are polished by laterally moving or vibrating a polishing cloth 40. Thus, oxide films 6 on the top portions of the solder balls 2 are removed and solder material is exposed as shown in FIG. 17(b). By welding the exposed portions of the solder balls 2 to the pads 743 in a nonoxidizing atmosphere, satisfactory bonding can be obtained.

The oxide films and the contaminant organic films covering the solder balls and the pads may be removed alternatively by a method using a laser beam. The laser beam may be projected on the oxide films in atmospheric conditions, in a vacuum, or in an atmosphere of He gas, to remove the oxide films and the contaminant organic films.

Figure 18:
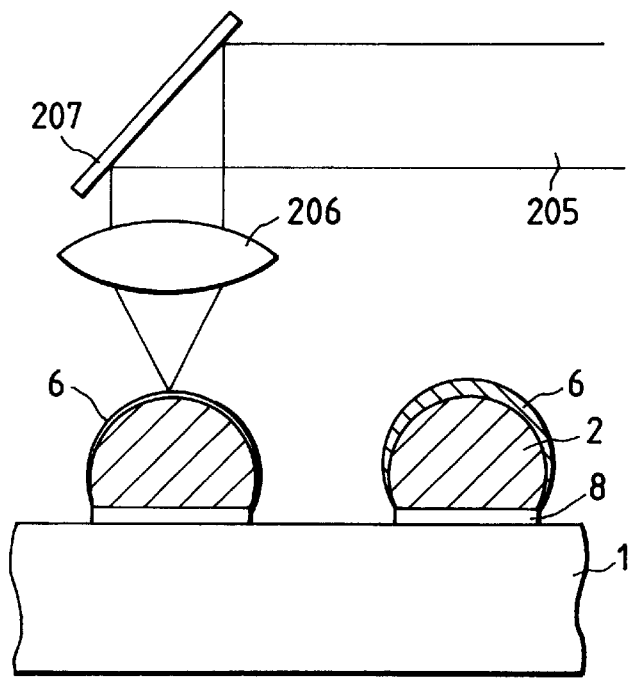
FIG. 18 is a sectional view illustrating a method of laser-beam cleaning a solder ball attached to an LSI chip.

FIG. 18 illustrates a cleaning method for cleaning solder balls welded to the substrate of an LSI circuit by using a laser beam. FIG. 18 shows the substrate 1 of an LSI circuit, metallized pads 8, solder balls 2, oxide/contamination layers 6 coating the surfaces of the solder balls 2, a laser beam 205, a lens 206, and a mirror 207. This method irradiates the surfaces of the solder balls 2 with the laser beam 205 to remove the oxide/contamination layers coating the surfaces of the solder balls 2.

Figure 19:
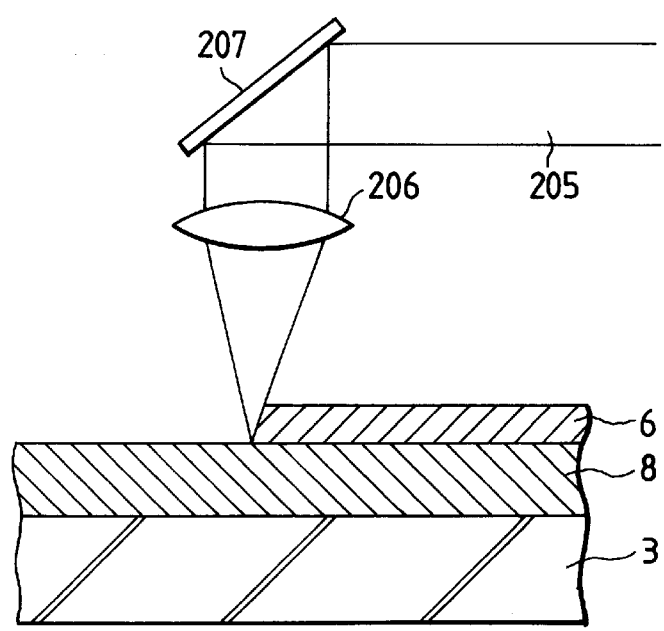
FIG. 19 is a sectional view illustrating a method of laser-beam cleaning a metallized surface of a member.

FIG. 19 illustrates a cleaning method for cleaning a metallized layer formed on the surface of a member, using a laser beam in accordance with the present invention. This method is capable of removing an oxide/contamination layer 6 coating the surface of the metallized layer 8 on a ceramic substrate 3.

The cleaning methods illustrated in FIGS. 18 and 19 cause the oxide/contamination layer coating the metal surface to evaporate by the energy of the laser beam 205, whereby the metal surface is melted. Therefore, the oxide film or contaminous film must be efficiently removed by irradiating the oxide/contamination layer with the laser beam 205 for a comparatively short time to prevent the reoxidation of the metal surface and to form no more than a thin oxide film, so that the members are bonded together satisfactorily by fluxless welding (soldering). For example, a pulse laser beam having a pulse width of 1 microsecond or below, a short wavelength, and a high photon energy, emitted by an excimer laser such as an Xe—Cl laser (wavelength 308 nm), is preferred. The energy density and the number of pulses to be applied to the object are determined according to the type of metal on which the oxide/contamination layer is present, and to form, preferably, a thin oxide film of no more than 5 nm. With these parameters, the person of ordinary skill can readily practice this embodiment of the invention.

FIG. 20 graphically illustrates the variation of thickness of thin oxide films formed over the surface of solder balls shown in FIGS. 15–19 against time, when the solder balls are kept in the atmosphere after mechanical cleaning, laser beam cleaning, and sputter cleaning. Blank triangles, solid circles, and blank circles represent solder balls subjected to laser beam cleaning, mechanical cleaning, and sputter cleaning, respectively. FIG. 20 indicates that there is no significant difference between these cleaning processes with regard to the formation of the thin oxide film.

The primary object of the foregoing embodiments of the present invention is the removal of oxide films by sputter cleaning, mechanical cleaning, or laser beam cleaning. However, the processes of sputter cleaning and mechanical cleaning can be omitted if the surfaces of, e.g., the solder balls are surface-treated so that no oxide film may be formed.

Figure 21A:
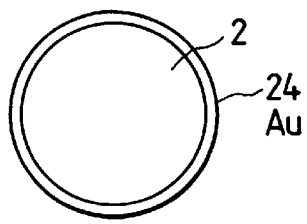
FIGS. 21(a)–21(e) show steps of welding a gold-plated solder ball to a substrate or part.
Figure 21B:
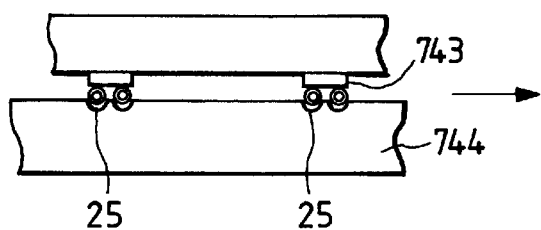
Figure 21C:
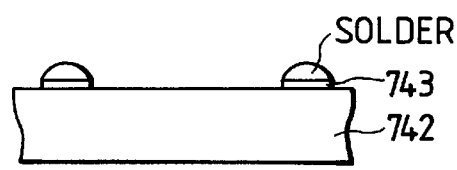

FIG. 21(a) illustrates a surface of a solder ball 2 which is plated with gold 24. The gold-plated solder balls 2 are located in recesses of a plate 744, and a substrate 742 having pads 743 is put on the plate 744 so that the pads 743 align with the solder balls 2, as shown in FIG. 21(b). Then, the solder balls are welded to the pads as shown in FIG. 21(c).

Figure 21D:
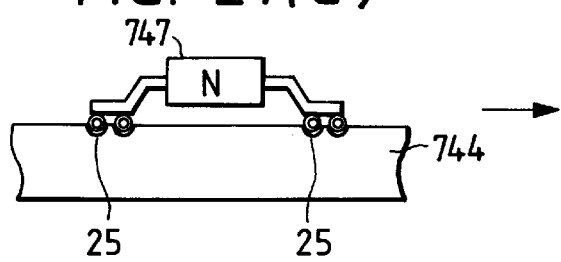
Figure 21E:
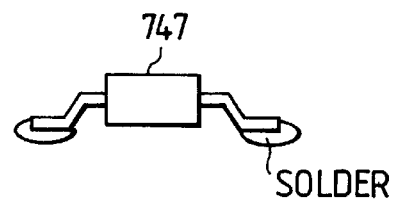

Similarly, as shown in FIGS. 21(d) and 21(e), the solder balls can be welded to leads of electronic parts 747. In this case, the pads 743 and/or the leads of the electronic parts 747 may be sputter-cleaned, mechanically-cleaned, or gold-plated.

The gold layer 24 on the solder ball 2 can be formed by, for example, a barrel plating technique. In barrel plating, solder balls 2 are put in a plating cage, which is dipped in a plating liquid while stirring the liquid.

The solder ball itself may be formed by an atomizing technique or by an oil tank method.

In the atomizing method, molten solder is dropped in a nonoxidizing atmosphere onto a surface, and takes the form of spherical particles due to surface tension. The solder particles are solidified and separated by size.

In the oil tank method, a predetermined number of solder pellets are thrown into an oil tank, and the oil is heated to a temperature greater than or equal to the melting point of the solder. The pellets are thus melted at a surface portion of the oil in the tank, and sink to a lower portion in the tank, where the temperature is lower than that of the surface. Thus, the solder pellets resolidify in spherical form due to their own surface tension.

The solder balls thus formed have an oxide film thereon. Therefore, they must be reduced in a diluted acid solution, and then plated with gold in the barrel plating tank.

It will be recalled that the fluxless soldering apparatus shown in FIG. 7 includes an alignment mechanism 300 for aligning two members to be soldered together. In this mechanism, the two members are aligned with each other, but are not temporarily fixed to each other prior to the soldering. Therefore, there is a risk that these two members will become misaligned due to vibrations experienced during transportation to the belt furnace 200 and/or transportation thereof within the belt furnace.

FIGS. 22–25 show alignment means for facilitating alignment of the two members and for preventing misalignment after the initial alignment.

Figure 22A:
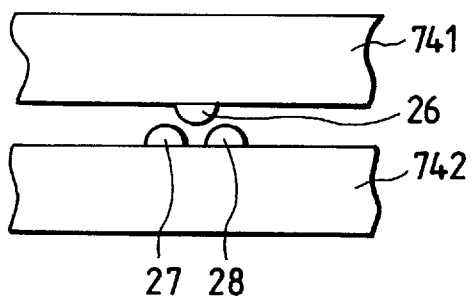
FIGS. 22(a)–22(b), 23(a)–23(b), 24(a)–24(b), and 25 are cross-sections illustrating member alignment according to the present invention.
Figure 22B:
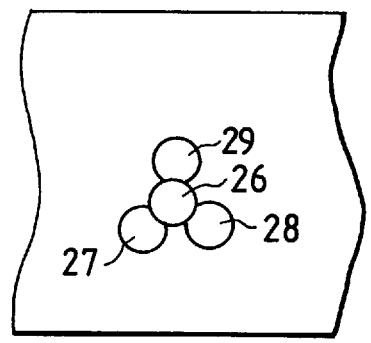

As shown in FIG. 22(a), a solder ball 26 protrudes from a member 741, which is to be soldered to a member 742. Moreover, a plurality of such solder balls protrude from corresponding portions of the member 742. In this embodiment, three solder balls 27, 28, and 29 are provided at respective apices of a triangle forming the protrusion means on the member 742. A central space is included in the three solder balls 27, 28, 29, as shown in FIG. 22(b). The positioning of the members 741 and 742 is performed by locating the solder ball 26 in the central space included in the triangularly-arranged solder balls 27, 28, 29.

By locating the solder ball 26 in the central space, there is no possibility for deviation in the positioning, and thus the accuracy of alignment is improved compared with the prior art scheme. Further, by providing at least two such combinations of solder balls, the alignment of members 741 and 742 can be made more exact.

Preferably, the solder balls are isolated electrically from conductive wirings of any electronic circuit associated with the members to be bonded together.

Figure 23A:
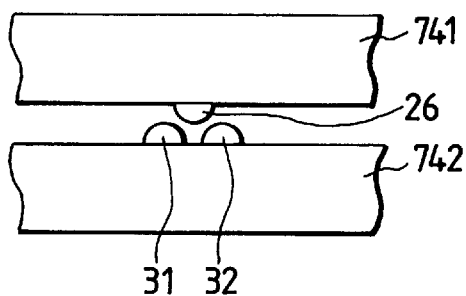
Figure 23B:
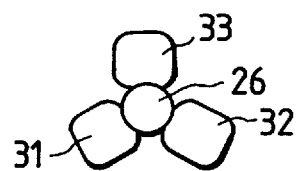

FIGS. 23(a) and 23(b) show another embodiment of the alignment in which the solder balls 27, 28, 29 are replaced by protrusions 31, 32, 33. The effect of this embodiment is substantially the same as that of the embodiment shown in FIGS. 22(a) and 22(b).

The protrusions 31, 32, 33 are constituted by a material such as PIQ resin, which may have a melting point sufficiently high that the resin melts little, if at all, at the soldering temperature or, if melted, has sufficient viscosity to prevent any mutual deviation in position between the members to be bonded.

Figure 24A:
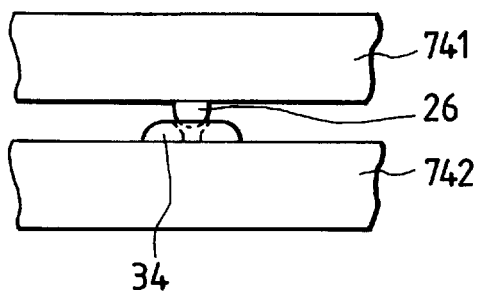
Figure 24B:
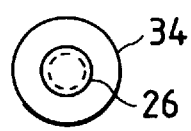

FIGS. 24(a) and 24(b) illustrate another embodiment in which, instead of the solder balls 27–29 or the protrusions 31–33, a ring-shaped protrusion 34 is employed. The protrusion 34 may be constituted by a solder material or a resin, as discussed above with respect to FIGS. 22(a), 22(b) and 23(a), 23(b), respectively. Each protrusion 34 has a center recess in which a solder ball bonded to the opposite member is received. Other modifications of this alignment means are possible so long as mutual deviation of the members to be bonded is prevented.

The ring-shaped protrusion 34 is preferably employed when the alignment area is limited. Solder balls are preferred when the alignment area is larger.

Figure 25:
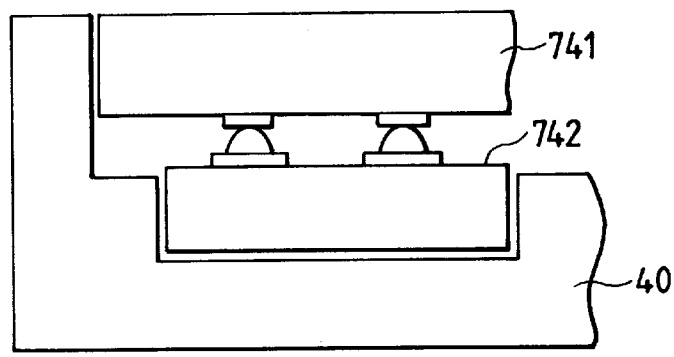

FIG. 25 illustrates an embodiment in which a jig 40 is used to maintain alignment of the members 741, 742.

An embodiment of the present invention that uses a liquid organic material for temporary fixation of the members to be bonded will be described in detail as applied to the mounting of electronic parts on a ceramic substrate, using $Sn_3Ag$ solder.

The melting point of $Sn_3Ag$ solder is 222° C. An organic material having an appropriate boiling point may be applied to the members before their alignment. The organic material must not contain flux and must evaporate without leaving any residue when heated. For example, the organic material may be a hydrocarbon, ketone, ester, aldehyde, or alcohol. An organic material having at least one hydroxyl group is particularly preferred because such an organic material can reduce and remove an oxide film coating the surface of a member to be soldered. Table 2 shows representative organic materials having at least one hydroxyl group.

TABLE 2

(under 1 atm pressure (760 Torr))

| Material | Chemical Formula | M.P. (°C.) | B.P. (°C.) |
| --- | --- | --- | --- |
| Propylene glycol | $CH_3CHOHCH_2OH$ | −60 | 188 |
| Ethylene glycol | $HOCH_2CH_2OH$ | −13 | 198 |
| Benzyl alcohol | $C_6H_5CH_2OH$ | −15 | 206 |
| Trimethylene glycol | $HOCH_2CH_2CH_2OH$ | −27 | 214 |
| Dipropylene glycol | $H(OC_3H_6)_2OH$ | −40 | 232 |
| 2-Phenoxyethanol | $C_6H_5(OCH_2CH_2)OH$ | −25 | 245 |
| Diethylene glycol | $H(OCH_2CH_2)_2OH$ | −7 | 245 |
| Tripropylene glycol | $H(OCH_2CH_2CH_2)OH$ | −20 | 273 |
| Triethylene glycol | $H(OCH_2CH_2)_3OH$ | −7 | 285 |
| Glycerol | $HOCH_2CHOHCH_2OH$ | 18 | 290 |
| Tetraethylene glycol | $H(OCH_2CH_2)_4OH$ | −6 | 314 |
| 3-Phenoxy-1, 2-propanediol | $C_6H_5OCH_2CHOHCH_2OH$ | 55 | 315 |
| Pentaethylene glycol | $H(OCH_2CH_2)_5OH$ | 0 | 370 |
| Hexaethylene glycol | $H(OCH_2CH_2)_6OH$ | 6 | 400 |

The organic material further ensures fixation after alignment, and shields the bonding portions effectively from the atmosphere. Preferably, the organic material is applied to the bonding portions such that adjacent bonding portions are separated from each other and discontinuous. Thus, the organic material is applied to the individual bonding portions, or forms a film around the bases of the electrodes of a wiring board or connecting terminals of an electronic part.

An organic material having an appropriate boiling point must be selected from those shown in Table 2, while taking into consideration the different evaporation rates of the organic materials in a heated atmosphere. Examinations have proved that the evaporation rate of an organic material in an He atmosphere is higher than those of the same organic material in an Ar atmosphere and in an $N_2$ atmosphere, and that the boiling point of an organic material to be used in an He atmosphere must be higher by 20°–30° C. than that of an organic material to be used in an Ar atmosphere or $N_2$ atmosphere.

FIGS. 26(a)–26(f) illustrate processes of manufacturing an electronic circuit device according to a preferred embodiment of the present invention. An electronic part (LSI chip) 1 is mounted on a ceramic substrate 3, to temporarily fix the electronic part 1 with a liquid organic material 301, and to bond the electronic part 1 to the ceramic substrate 3 by reflow soldering.

Figure 26A:
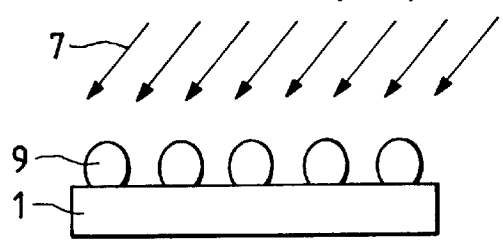
FIGS. 26(a)–26(f) are sectional views of a workpiece in different phases of an electronic circuit device fabricating method according to a preferred embodiment of the present invention.
Figure 26B:
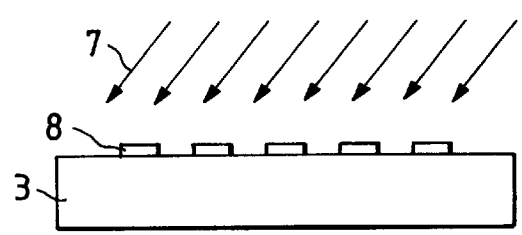

FIGS. 26(a) and 26(b) are sectional views illustrating a pretreatment process for cleaning the surfaces of the electronic part 1 and the ceramic substrate 3. Preferably, this embodiment uses an Ar atom beam 7 for cleaning, although the surfaces may be cleaned by a mechanical cleaning process or with a laser beam.

Figure 26C:
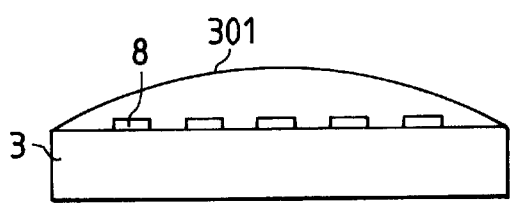

FIGS. 26(c)–26(f) illustrate the processes for bonding by reflow soldering, carried out after the surfaces have been cleaned. As shown in FIG. 26(c), the liquid organic material 301 is applied to the surface of the ceramic substrate 3 to cover all bonding portions 8 until the electronic part 1 is bonded completely to the ceramic substrate 3, and to reduce oxide films coating solder balls 9. When reflow soldering is carried out in an Ar or $N_2$ atmosphere, 2-phenoxyethanol (B.P.: 245° C.) is suitable. When reflow soldering is carried out in an He atmosphere, triethylene glycol (B.P.: 285° C.) is suitable.

Figure 26D:
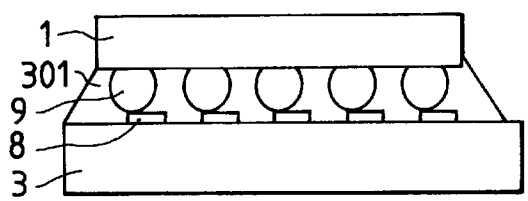

As shown in FIG. 26(d), the electronic part 1 may be provided with the solder balls 9. The electronic part 1 is placed on the pads 8 of the ceramic substrate 3, and positioned so that the solder balls 9 coincide with the centers of the pads 8. FIG. 26(d) shows the solder balls 9 intentionally dislocated from the centers of the corresponding pads 8 to illustrate the self-alignment effect of the embodiment. Thus, the electronic part 1 is fixed temporarily to the ceramic substrate 3 by the viscosity and surface tension of the organic material 301, preventing the dislocation of the electronic part I relative to the ceramic substrate 3 due to vibrations during transportation before reflow soldering.

Figure 26E:
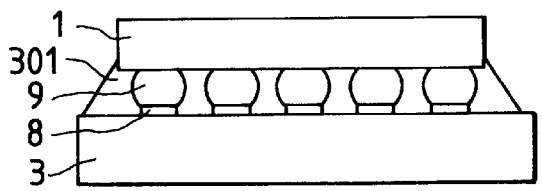

As shown in FIG. 26(e), the bonding portions are coated with the organic material 301 in a heating process for heating the solder balls 9, whereby the oxidation of the solder balls 9 is inhibited. For example, an organic material of the alcohol type reduces and removes the oxide coating the solder balls 9, enhances the wettability of the pads 8 to the solder balls 9, and enables quick self-alignment and satisfactory bonding.

Figure 26F:
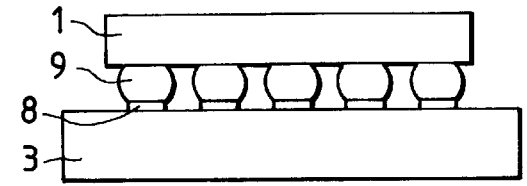

After bonding has been completed, the organic material 301 evaporates completely during a cooling process as shown in FIG. 26(f); hence, after-cleaning is unnecessary. Thus, a highly reliable electronic circuit device comprising the ceramic substrate 3 and the LSI chip bonded to the ceramic substrate 3 can be easily fabricated.

FIGS. 27(a)–27(g) and 28(a)–28(f) further illustrate the behavior of the solder balls when bonding an electronic part to a substrate by reflow soldering. The following explanation relates to the effect of temporarily fixing the electronic part to the substrate with an organic material, as discussed above, for preventing the dislocation of the electronic part relative to the substrate, shielding bonding portions from the atmosphere, facilitating self-alignment, and realizing highly reliable soldering.

The steps shown in FIGS. 27(a)–27(g) illustratively employ an organic material that has no hydroxyl group in the molecules other than those shown in Table 2. This method employs, for example, tridecane $CH_3(CH_2)_{11}CH_3$ (B.P.: 234° C.), 1-methylnaphthalene $CH_3C_{10}H_7$ (B.P.: 234° C.), or the like when reflow soldering is carried out in an Ar or $N_2$ atmosphere. Hexadecane $CH_3(CH_2)_{14}CH_3$ (B.P.: 287° C.) or the like is used when reflow soldering is carried out in an He atmosphere.

Figure 27A:
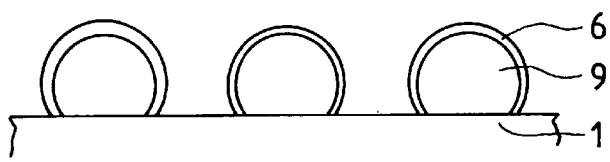
FIGS. 27(a)–27(g) are sectional views of a workpiece in different phases of an electronic circuit device fabricating method in which an organic material that has no hydroxyl group is employed for surface cleaning in accordance with the teachings of the present invention.
Figure 27B:
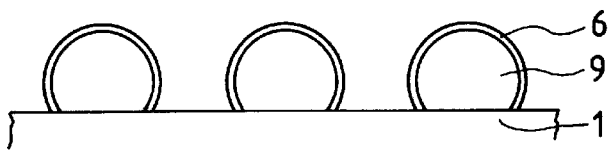

Referring now to FIG. 27(a), the surfaces of the solder balls 9 formed on the electronic part 1 are coated with an oxide film (or an organic contaminant film) 6. Since the solder has been melted to form the solder balls 9, the thickness of the oxide film 6 may be as large as several tens to several hundreds nanometers, and varies from portion to portion. Therefore, as shown in FIG. 27(b), the connecting surfaces are cleaned to reduce and even out the thicknesses of the oxide films 6 (or the organic contaminant films) coating the solder balls 9 of the electronic part 1 and pads 8 formed on the ceramic substrate 3 (FIG. 27(c)).

Figure 27C:
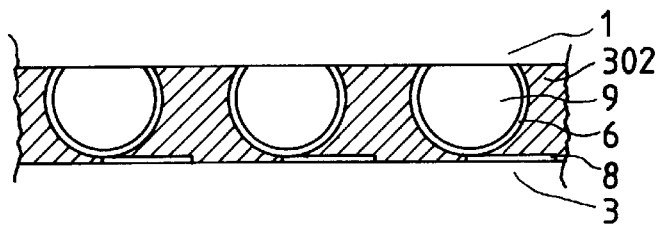

Then, as shown in FIG. 27(c), the electronic part 1 is positioned and mounted on the ceramic substrate 3, which has been coated with an organic material 302 having no hydroxyl group. The organic material 302 covers the bonding portions 8 and holds the electronic part 1 so that the electronic part 1 is not dislocated relative to the ceramic substrate 3 by vibrations that may occur during processes between the mounting and the heating for reflow soldering.

Figure 27D:
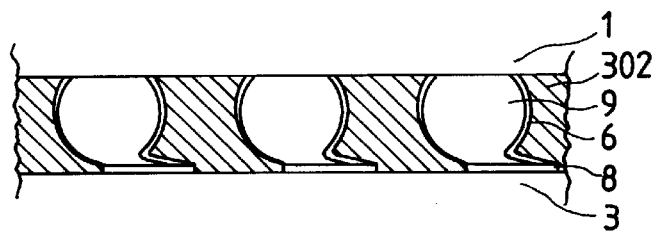
Figure 27E:
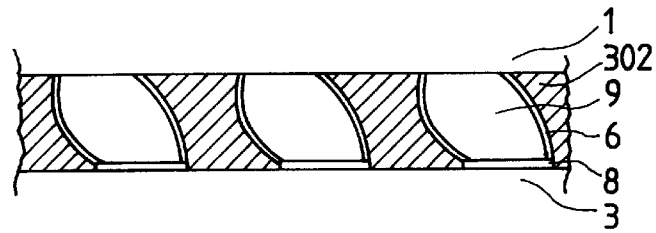

Then, as shown in FIG. 27(d), the solder balls 9 are melted in the heating process, and the molten solder spreads over the pads 8 of the ceramic substrate 3. The molten solder balls 9 self-align with the corresponding pads 8 as shown in FIG. 27(e).

Figure 27F:
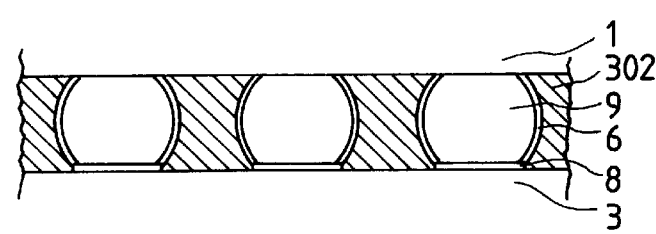
Figure 27G:
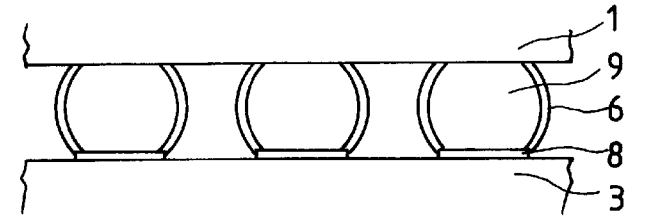

The organic material 302 covers the solder balls 9 and the pads 8 until the electronic part 1 is completely bonded to the ceramic substrate 3 as shown in FIG. 27(f), preventing the oxidation of the solder balls 9 and the pads 8, and promoting the spread of the solder by shielding the solder balls 9 and the pads 8 from the heating atmosphere. The organic material 302 evaporates during the heating process, leaving no residue as shown in FIG. 27(g). Therefore, cleaning is unnecessary after the electronic part 1 has been completely bonded to the ceramic substrate 3.

Figure 28A:
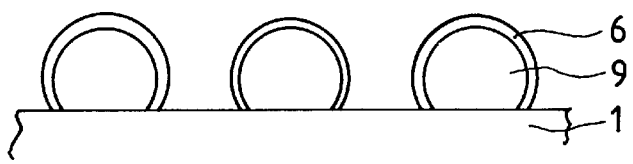
FIGS. 28(a)–28(f) are sectional views of a workpiece in different phases of an electronic circuit device fabricating method in which an organic material having hydroxyl groups is employed in a surface cleaning technique according to the present invention.
Figure 28B:
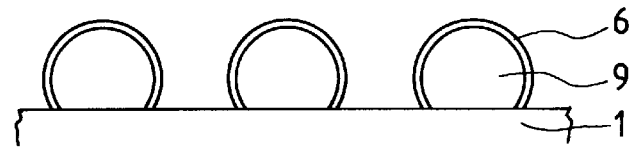
Figure 28C:
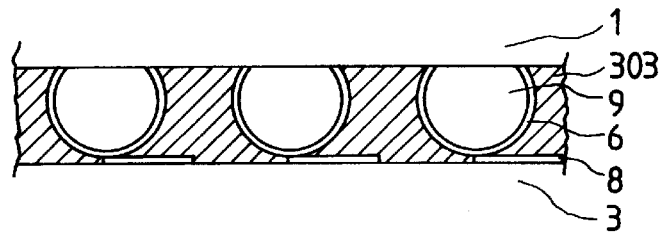
Figure 28D:
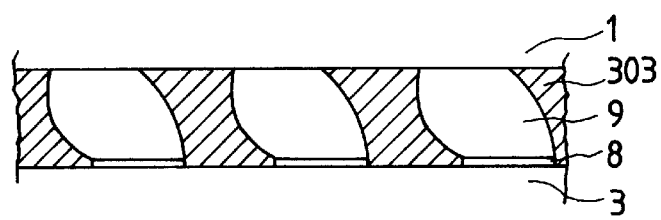
Figure 28E:
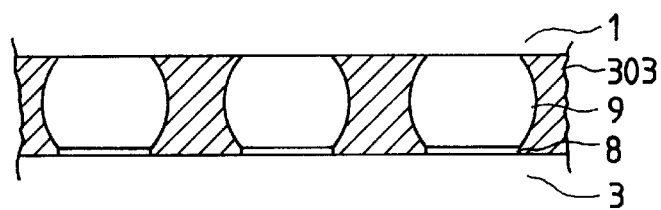

FIGS. 28(a)–28(f) illustrate a similar electronic circuit device fabricating method, but wherein the organic material has hydroxyl groups in the molecules. By comparison to the reflow soldering process shown in FIGS. 27(d) and 27(e), the steps shown in FIGS. 28(d) and 28(e) are capable of completely removing thin oxide films 6 remaining after the surface cleaning process by the reducing action of an organic material 3 having hydroxyl groups. The steps shown in FIGS. 28(a) and 28(b), similarly to those shown in FIGS. 27(a) and 27(b), reduce and even up the thicknesses of the oxide films (or organic contaminant films) 6 coating the solder balls 9 and the pads 8. The solder balls 9 and the pads 8 are covered with the organic material 303 having the hydroxyl groups, as shown in FIG. 28(c).

In the heating process (i.e., the reflow soldering process), the solder balls 9 and pads 8 are protected from oxidation, and the oxide films 6 are reduced and removed, as shown in FIGS. 28(d) and 28(e). Thus, this embodiment enhances the wettability of the pads 8 and facilitates the self-alignment of the solder balls 9 with the pads 8 more effectively, as compared with the method illustrated in FIGS. 27(a)–27(g).

Figure 28F:
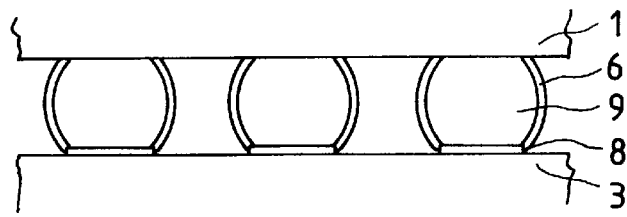

The organic material 303 evaporates completely, leaving no residue, as shown in FIG. 28(f); hence, a further cleaning process is unnecessary.

Figure 29A:
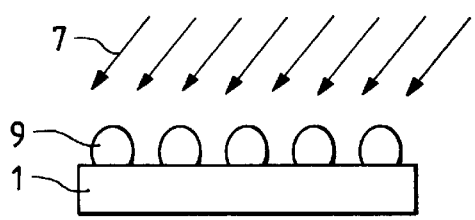
FIGS. 29(a)–29(f) are sectional views of a workpiece in different phases of an electronic circuit device fabricating method having a step of supplying an organic material to individual connecting terminals, wherein the connecting terminals are separated from each other.
Figure 29B:
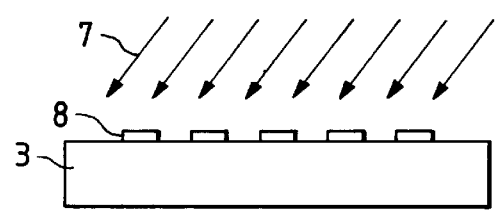

FIGS. 29(a)–29(f) illustrate another method embodying the present invention, that covers pads 8 and solder balls 9 individually and discontinuously. As shown in FIGS. 29(a) and 29(b), a cleaning process similar to the pretreatment process illustrated in FIGS. 26(a) and 26(b) is carried out to remove oxide films and organic contaminant films coating the solder balls 9 of the electronic part 1 and the pads 8 of the ceramic substrate 3. The present embodiment applies a smaller quantity of organic material than that applied to the ceramic substrate 3 in the method illustrated in FIGS. 26(a)–26(f). Therefore, it is desirable to use an organic material having a boiling point higher than that of the organic material employed in the method of FIGS. 26(a)–26(f). Preferred organic materials include, for example, triethylene glycol (B.P.: 285° C.), tetraethylene glycol (B.P.: 314° C.), and the like when reflow soldering is carried out in an Ar or $N_2$ atmosphere, or tetraethylene glycol (B.P.: 314° C.), pentaethylene glycol (B.P.: 370° C.), and the like when reflow soldering is carried out in an He atmosphere.

Figure 29C:
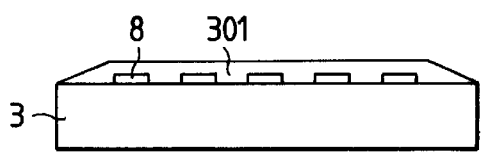
Figure 29D:
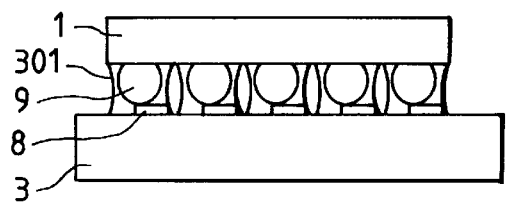
Figure 29E:
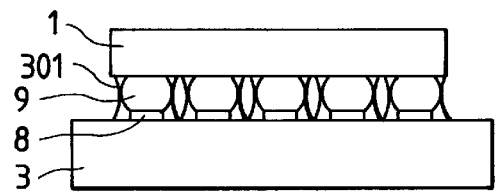
Figure 29F:
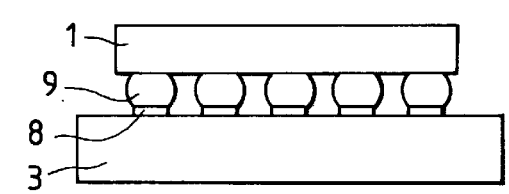

As shown in FIG. 29(c), a thinner layer of organic material 301 is applied to the ceramic substrate 3, so that the thickness of the organic material 301 is two-thirds the height of the solder balls 9, or less. Consequently, each combination of a solder ball 9 and a pad 8 is aligned and covered individually with the organic material 301 by the agency of the wettability and surface tension of the organic material 301 as shown in FIG. 29(e), even though the electronic part 1 is misaligned when initially mounted on the ceramic substrate 3 as shown in FIG. 29(d). The organic material 301, being of the alcohol type, prevents the oxidation of the solder balls 9 and reduces and removes the oxide films coating the solder balls 9, so that the solder balls 9 melt and spread satisfactorily, and so that the self-alignment of the solder balls 9 with the corresponding pads 8 can be achieved in a short time. In a subsequent cooling process, the organic material 301 evaporates completely without leaving any residue, as shown in FIG. 29(f); hence, no subsequent cleaning process is necessary.

Figure 30:
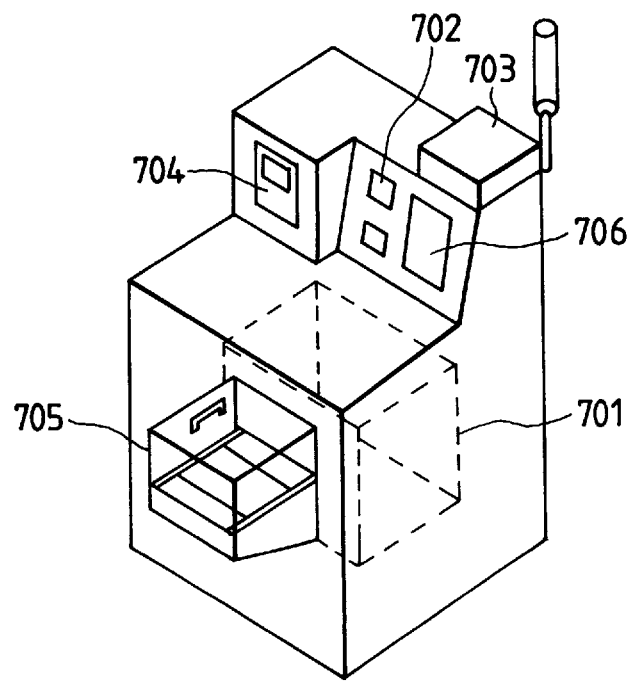
FIG. 30 is a perspective view of a heating device included in a preferred embodiment of the present invention.
Figure 31:
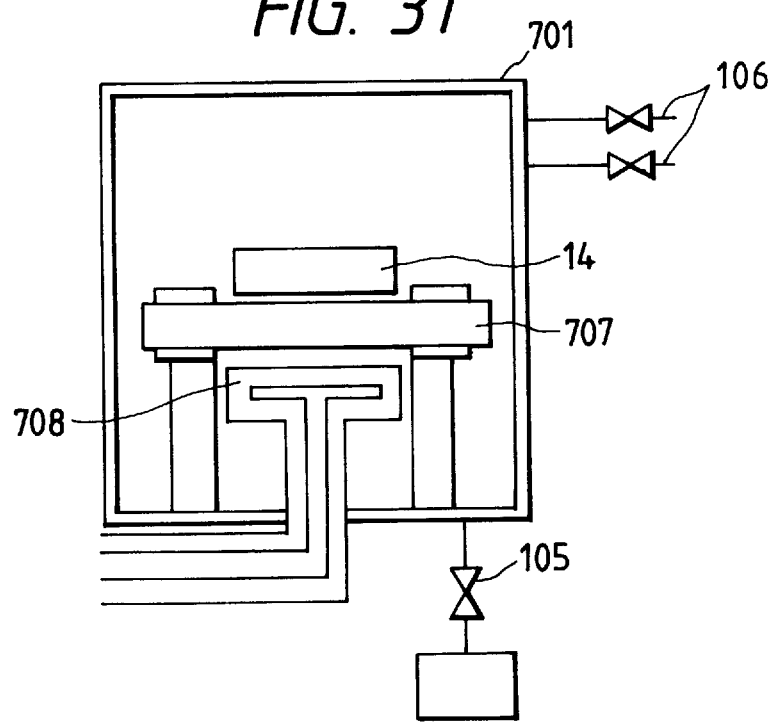
FIG. 31 is a schematic sectional view of a processing vessel disposed within a heating device according to a preferred embodiment of the present invention.

FIGS. 30 and 31 are a perspective view and a sectional view, respectively, of a heating device for use in the foregoing embodiments. With additional reference to FIGS. 26(d) and 29(d), a workpiece 14 is obtained by aligning and temporarily fastening together the electronic part 1 and the ceramic substrate 3 using the organic material 301. Then, the solder balls 9 of the electronic part 1 and pads 8 of the ceramic substrate 3 are bonded together by heating the workpiece 14 using the heating device shown in FIG. 30. The heating device comprises a vessel 701 in which the workpiece is subjected to heating and cooling to bond the solder balls to the pads 8; a pressure controller for controlling the evaporation rate of the organic material 301; an oxygen concentration monitoring unit 703 for monitoring the oxygen concentration in the atmosphere within the vessel 701; a temperature controller 704 for controlling a carbon heater 707 for heating the workpiece 14 and the solder balls 9; a conveying unit 705 for conveying the workpiece to carry out a series of processes automatically; and a controller 706 for generally controlling the automatic operations of the heating device.

As shown in FIG. 31, the carbon heater 707, a water-cooled metallic cooling plate 708 for cooling the hot carbon heater 707, and the workpiece 14 are disposed within the vessel 701. The workpiece 14 is mounted on the carbon heater 707 for processing. A gas supply system 106 and evacuating system 105 are connected to the vessel 701 to regulate the heating atmosphere in the vessel 701.

The workpiece 14 is placed in the conveying unit 705, and then a robot transfers the workpiece 14 from the conveying unit 705 onto the carbon heater 707, as shown in FIG. 31. Then, the evacuating system 105, which comprises a rotary pump or the like, evacuates the vessel 701, and the gas supply system 106 supplies a nonoxidizing gas such as He, $N_2$, or Ar gas, or a reducing gas, such as a mixture of $H_2$ gas and $N_2$ gas into the vessel 701 so that the gas pressure in the vessel 701 is equal to the atmospheric pressure.

In this state, the oxygen concentration monitoring unit 703 measures the oxygen concentration of the gas filling up the vessel, 701. If the oxygen concentration is not equal to or below a predetermined oxygen concentration (preferably 20 ppm or below), the evacuating operation and the gas supply operation are repeated.

After thus creating a heating atmosphere within the vessel 701, the workpiece 14 is heated by the carbon heater 707 by direct heat conduction while continuously monitoring the heating condition. The temperature controller 704 controls the heating operation of the carbon heater 707 so that the solder balls 9 are heated at a temperature higher than their melting point. If the solder balls 9 are formed of $Sn_3Ag$ solder having a melting point of 221° C., the carbon heater 707 is set for 250° C.

Upon the start of heating, the liquid organic material for temporarily fixing the electronic part 1 to the ceramic substrate 3 starts to evaporate. When desirable, the pressure of the heating atmosphere is set to a negative pressure (a positive pressure) to promote (to suppress) the evaporation of the liquid organic material.

After the solder balls 9 have been melted and the bonding of the solder balls 9 to the pads 8 has been completed, cooling water is circulated through the water-cooled metallic cooling plate 708 to cool the hot carbon heater 707 and the workpiece 14. Then, the workpiece 14 is removed from the vessel 701 by the conveying unit 705. The liquid organic material is used for (1) temporary fixation, (2) oxidation prevention, and (3) reduction and removal of oxide.

The mode of covering the solder balls 9 and the pads 8 is determined according to the purpose of using the liquid organic material. When a liquid organic material having a boiling point below the melting point of the solder is used for the purpose of temporary fixation, the liquid organic material evaporates completely at a high evaporation rate during the reflow soldering process. When a liquid organic material is used for the purpose of coating the solder balls 9 and the pads 8 to prevent oxidation and reduce/remove the oxides, the solder balls 9 and the pads 8 must be kept coated with the organic material until the solder balls 9 are bonded completely to the pads 8. In this case, an organic material having a boiling point higher than the melting point of the solder may be used. However, such an organic material evaporates at a low evaporation rate, and there is a high possibility that the organic material does not evaporate completely during the reflow soldering process and remains on the workpiece.

This embodiment evacuates the vessel 701 in a vacuum to make the liquid organic material evaporate completely before the workpiece 14 is cooled by the cooling plate 708, so that subsequent cleaning can be omitted. The evaporation of the liquid organic material can be simply controlled by controlling the pressure of the heating atmosphere during the reflow soldering process.

Figure 32A:
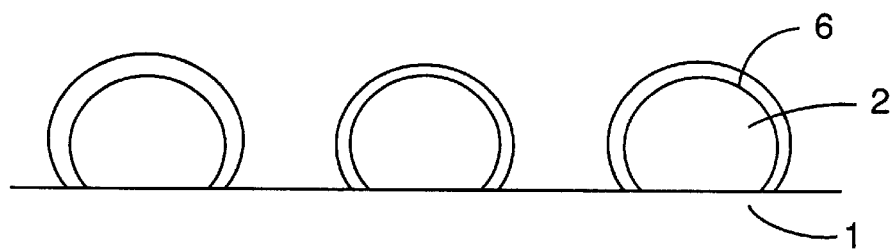
FIGS. 32(a)–32(d) illustrate steps for removing an oxide film from a solder ball using an organic-material heat-cleaning method according to the present invention.
Figure 32B:
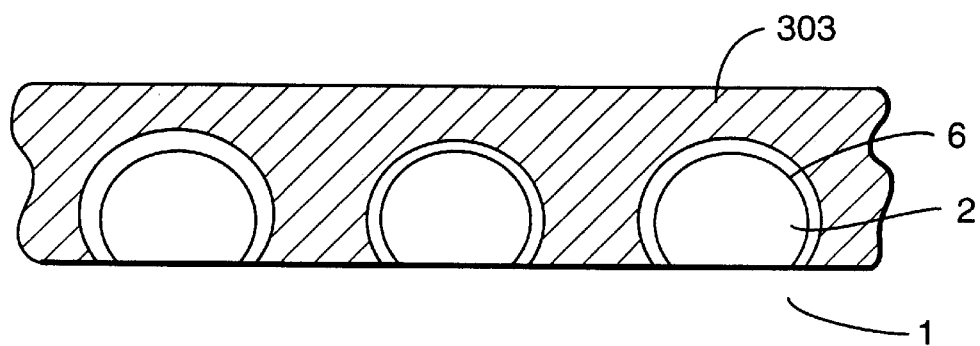
Figure 32C:
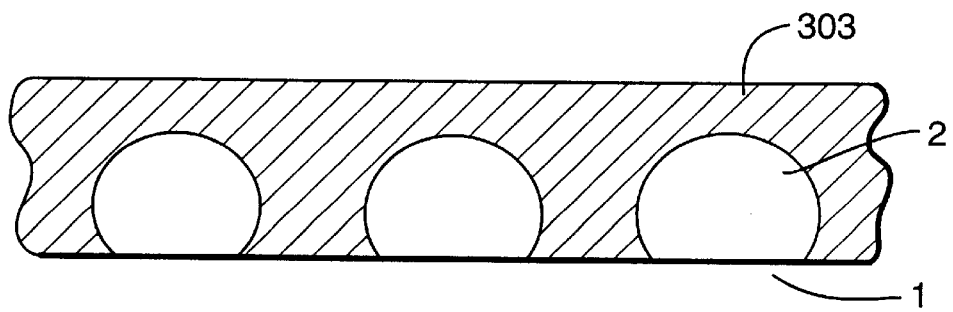
Figure 32D:
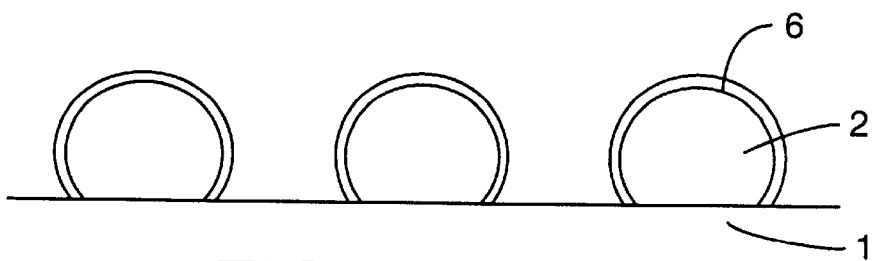

FIGS. 32(a)–32(d) illustrate steps for removing the oxide film 6 from a solder ball 2 on a substrate 1 by organic material heat cleaning. A surface of a solder ball 2 on which a thick oxide film 6 is formed is shown in FIG. 32(a). Organic material 303 having a hydroxyl group is supplied over the solder ball 2 as shown in FIG. 32(b). Then, the thick oxide film 6 is removed by heating (FIG. 32(c)). The organic material 303 has an agency to reduce and remove an oxide film. Then, the organic material is vaporized (FIG. 32(d)). Therefore, the organic material 303 has the ability to clean an oxide film like a sputter cleaning method using atoms or ions, a mechanical cleaning method, or a laser cleaning method.

In summary, the present invention removes by sputter-cleaning the oxide/contaminant films coating the solder balls and pads of members to be joined together, and joins the members together in the atmosphere so that the solder balls are aligned with the corresponding pads. Therefore, the positioning apparatus need not be installed in a vacuum.

Further, since the reflow soldering process can be carried out by using a general purpose belt furnace, the ease of processing and the productivity can be enhanced. Since the oxide/contaminant films coating the solder balls and the pads can be removed by mechanical cleaning, the sputter cleaning apparatus may be omitted or the duration of sputter cleaning may be curtailed, to enhance the efficiency of the bonding process. Since the oxide/contaminant films coating the solder balls and the pads can be removed with a laser beam in any one of the atmosphere, a vacuum, or a helium atmosphere, an existing apparatus having such an atmosphere can be employed in carrying out the electronic circuit device fabricating method.

The solder balls may be Au-plated to omit the sputter cleaning process or the mechanical cleaning process, which enhances the ease of work and the productivity. Since the solder balls formed by an atomizing process or an oil tank process are subjected to a reducing process using a weak acid solution to remove the oxide/contaminant films coating the solder balls, and then the solder balls are Au-plated, the Au-plated solder balls have an excellent bonding property.

The projections and recesses formed on the members to be joined together facilitate the alignment of the members, and prevent the dislocation of those members relative to each other due to vibrations during transportation. Further, since an organic material is applied to the pads to temporarily fix the electronic parts on a circuit substrate, the dislocation of the members is prevented.

Since the workpiece prepared by combining the members to be joined together is placed in the receiving chamber, the receiving chamber is evacuated to remove adsorbed detrimental gases, and then the workpiece is heated in a nonoxidizing atmosphere or a reducing atmosphere, the surface of the solder balls are not oxidized before melting and highly reliable fluxless soldering can be achieved. Since the solder balls and the pads are covered with the liquid organic material for temporarily fixing together the members to be joined to prevent the oxidation of the solder balls and the pads or to reduce and remove the oxide films coating the solder balls and the pads, stable, highly reliable bonding can be achieved.

Optimum soldering conditions can be established by controlling the concentration of the nonoxidizing or the reducing gas in the heating and melting means. The spreadability of the solder is improved through the prevention of oxidation, and the liquid organic material can be completely evaporated by controlling the pressure of the atmosphere in the heating and melting means, to control the evaporation of the liquid organic material. The efficiency of the electronic circuit device fabricating apparatus can be enhanced by using the belt conveyor for conveying the members to be joined together.

While the present invention has been particularly shown and described with reference to preferred embodiments thereof, it will be understood by those skilled in the art that the foregoing and other modifications in form and detail may be made without departing from the spirit and scope of the present invention.

We claim:

1. A method of soldering for use in fabricating an electronic circuit device, comprising the steps of:
   removing at least one of an oxide layer and a contamination layer from respective surfaces of a solder material and at least one member to be connected thereto;
   supplying said at least one member and said solder material with organic material;
   aligning said at least one member and said solder material in an oxidizing atmosphere; and
   heating said solder material in a nonoxidizing atmosphere to melt the solder material.

2. A method of soldering as claimed in claim 1, wherein said removing step is performed by sputter-cleaning using at least one of atom and ion beam irradiation.

3. A method of soldering as claimed in claim 1, wherein said removing step is performed mechanically.

4. A method of soldering as claimed in claim 1, wherein said removing step is performed by laser beam cleaning.

5. A method of soldering as claimed in claim 1, wherein said solder material is at least one selected from a group consisting of alloys of Pb and Sn, alloys of Sn and Ag, alloys of Au and Pb, alloys of Au and Ge, and alloys of Au and Si.

6. A method of soldering as claimed in claim 1, wherein said aligning step is performed in an oxidizing atmosphere for at most six hours.

7. A method of soldering as claimed in claim 1, wherein said nonoxidizing atmosphere is prepared by supplying a nonoxidizing gas to a vacuum atmosphere.

8. A method of soldering as claimed in claim 7, wherein said nonoxidizing gas is an inert gas.

9. A method of soldering as claimed in claim 8, wherein said inert gas is selected from the group consisting of (1) $N_2$, (2) Ar, (3) He, and (4) a mixture of $N_2$, Ar, and He.

10. A method of soldering as claimed in claim 8, wherein said inert gas is selected from the group consisting of (1) $N_2$, (2) Ar, (3) He, and (4) a mixture thereof; and wherein said heating step atmosphere is controlled by controlling the pressure of said vacuum atmosphere and the concentration of said nonoxidizing gas.

11. A method of soldering as claimed in claim 8, wherein said nonoxidizing gas is a reducing gas.

12. A method of soldering as claimed in claim 8, wherein said nonoxidizing gas is an active gas.

13. A method of soldering as claimed in claim 12, wherein said active gas is selected from the group consisting of (1) a mixture of $H_2$ and $N_2$ and (2) $H_2$.

14. A method of soldering as claimed in claim 8, wherein said nonoxidizing gas is a fluorocarbon vapor.

15. A method of soldering as claimed in claim 1, wherein said aligning step is performed in an oxidizing atmosphere for at most 8 hours.

16. A method of soldering as claimed in claim 1, wherein said aligning step is performed in an oxidizing atmosphere for a time sufficiently limited such that an oxide layer formed on the solder material during the aligning step has a thickness of at most 5 nm.

17. A method of soldering as claimed in claim 1, wherein said aligning step is performed by fitting protrusions formed on at least one member in recesses formed by protrusions formed on another member.

18. A method of soldering as claimed in claim 1, wherein said heating step is performed to segment any oxide layer formed on the solder material during the aligning step so as to expose the solder material.

19. A method of soldering as claimed in claim 1, wherein after said aligning step, organic material is present on said at least one member and said solder material.

20. A method of soldering as claimed in claim 1, wherein after said aligning step, organic material is present in said at least one member and said solder material, and wherein after said heating step, organic material is evaporated.

21. A method of soldering as claimed in claim 1, wherein the melting point of said organic material is higher than that of said solder material.

22. A method of soldering as claimed in claim 1, wherein said organic material contains hydroxyl groups in its molecules.

23. A method of soldering as claimed in claim 1, wherein said heating step atmosphere is controlled by controlling the pressure of said vacuum and the concentration of said nonoxidizing gas, and wherein after said heating step, organic material is evaporated.

24. A method of soldering for use in fabricating an electronic circuit device, comprising the steps of:

removing at least one of an oxide layer and a contamination layer from respective surfaces of a solder material and at least one member to be connected thereto;

oxidizing said surfaces to form a thin oxide layer thereon;

supplying said at least one member and said solder material with organic material;

aligning said at least one member and said solder material; and heating said solder material in a nonoxidizing atmosphere to melt the solder material.

25. A method of soldering for use in fabricating an electronic circuit device, comprising the steps of:

processing a solder material to ensure that no oxide layer and no contamination layer are present thereon;

supplying said at least one member and said solder material with organic material;

aligning said at least one member and said solder material in an oxidizing atmosphere; and heating said solder material in a nonoxidizing atmosphere to melt the solder material.

26. A method of soldering as claimed in claim 25, wherein said processing step includes the step of providing solder balls each plated with gold.

27. A method of soldering as claimed in claim 25, wherein said processing step includes the step of removing at least one of an oxide layer and a contamination layer from the surface of said solder material.

* * * * *

UNITED STATES PATENT AND TRADEMARK OFFICE
CERTIFICATE OF CORRECTION

PATENT NO. : 5,878,943
DATED : March 9, 1999
INVENTOR(S) : T. Nishikawa, et al.

It is certified that error appears in the above-identified patent and that said Letters Patent is hereby corrected as shown below:

<u>ON THE TITLE PAGE</u>

Under the Foreign Application Priority Data, please add the following information.

```
Aug. 28, 1991   [JP]   Japan     P03-216953
Dec. 27, 1991   [JP]   Japan     P03-345829
Apr. 22, 1992   [JP]   Japan     P04-102952
Dec. 28, 1993   [JP]   Japan     P05-334603
Dec. 22, 1994   [JP]   Japan     P06-319810
```

Column 1, lines 9-18, delete in their entirety and insert:

--This application is a continuation –in part of U.S. Patent Application Serial No. 08/578,054, filed on December 22, 1995, now U.S. Patent 5,816,473;
which is a continuation application of U.S. Patent Application Serial No. 08/240,320, filed on May 10, 1994, now abandoned, the entire disclosure of which is hereby incorporated by reference; which is a divisional application of U.S. Patent Application Serial No. 07/890,255, filed on May 29, 1992, now U.S. Patent No. 5,341,980, which is a continuation-in-part of U.S. Patent Application Serial No. 07/656,465, filed on February 19, 1991, now abandoned.--.

Signed and Sealed this

Twenty-seventh Day of March, 2001

Attest:

NICHOLAS P. GODICI

*Attesting Officer*           *Acting Director of the United States Patent and Trademark Office*